US011132956B2

(12) United States Patent
Seo

(10) Patent No.: US 11,132,956 B2
(45) Date of Patent: Sep. 28, 2021

(54) DISPLAY DEVICE

(71) Applicant: SAMSUNG DISPLAY CO., LTD., Yongin-si (KR)

(72) Inventor: Haekwan Seo, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 51 days.

(21) Appl. No.: 16/666,818

(22) Filed: Oct. 29, 2019

(65) Prior Publication Data
US 2020/0135120 A1 Apr. 30, 2020

(30) Foreign Application Priority Data

Oct. 29, 2018 (KR) .......................... 10-2018-0129847

(51) Int. Cl.
G09G 3/3291 (2016.01)
H01L 27/32 (2006.01)
G06F 1/16 (2006.01)

(52) U.S. Cl.
CPC ......... *G09G 3/3291* (2013.01); *G06F 1/1683* (2013.01); *H01L 27/3258* (2013.01); *H01L 27/3265* (2013.01); *G09G 2370/16* (2013.01)

(58) Field of Classification Search
CPC .............. G09G 3/3291; G09G 2370/16; H01L 27/3258; H01L 27/3265; H01L 27/3211; H01L 27/3248; H01L 27/3244; H01L 27/3279; G06F 1/1683
See application file for complete search history.

(56) References Cited

U.S. PATENT DOCUMENTS

| 10,140,949 | B2 | 11/2018 | Seo | |
|---|---|---|---|---|
| 10,152,943 | B2 | 12/2018 | Park et al. | |
| 2014/0300649 | A1* | 10/2014 | Park | G09G 3/3208 345/690 |
| 2016/0203787 | A1* | 7/2016 | Park | G06F 3/04164 345/206 |
| 2017/0162119 | A1 | 6/2017 | Kim et al. | |

(Continued)

FOREIGN PATENT DOCUMENTS

| KR | 1020160085981 A | 7/2016 |
|---|---|---|
| KR | 1020180005319 A | 1/2018 |

(Continued)

*Primary Examiner* — Amit Chatly
(74) *Attorney, Agent, or Firm* — Cantor Colburn LLP

(57) ABSTRACT

A display device includes: a display substrate in which a display area and a non-display area surrounding the display area are defined, where the display area includes a plurality of pixels; and a display driving chip disposed on the display substrate. The display substrate includes: a base substrate; a first conductive layer disposed on the base substrate; a first insulating layer disposed on the first conductive layer; and a second conductive layer disposed on the first insulating layer. The first conductive layer includes a first capacitor electrode disposed in the non-display area. The second conductive layer includes a second capacitor electrode disposed in the non-display area. The first and second capacitor electrodes overlap each other with the first insulating layer therebetween and collectively defined a first capacitor. The first and second capacitor electrodes are connected to the display driving chip.

19 Claims, 15 Drawing Sheets

(56) References Cited

U.S. PATENT DOCUMENTS

2018/0090975 A1  3/2018 Lee et al.
2018/0151838 A1* 5/2018 Park ..................... G06F 3/0412
2018/0151943 A1  5/2018 Lee et al.
2020/0343314 A1* 10/2020 Nakamura ........... H01Q 1/2208

FOREIGN PATENT DOCUMENTS

KR   1020180032902 A   4/2018
KR   1020180060163 A   6/2018
KR    101888911 B1    8/2018

* cited by examiner

DISPLAY DEVICE

This application claims priority to Korean Patent Application No. 10-2018-0129847, filed on Oct. 29, 2018, and all the benefits accruing therefrom under 35 U.S.C. § 119, the content of which in its entirety is herein incorporated by reference.

BACKGROUND

1. Field

Embodiments of the invention relate to a display device, and more particularly, to a display device including a display panel wirelessly connected to a printed circuit board ("PCB").

2. Discussion of Related Art

Various display devices used in multimedia devices, e.g., televisions, mobile phones, tablet computers, navigation systems, and game machines, are being developed. A display device may include a display panel for displaying images.

A display device typically includes a display panel for displaying images and a controller for generating various signals or data for driving the display panel. The controller may be implemented with various circuits and electronic elements on a printed circuit board ("PCB") bonded to the display panel.

SUMMARY

In a display device, a printed circuit board ("PCB") and a display panel may be wirelessly connected to each other without direct connection via lines. A wireless transmission antenna unit of the PCB may wirelessly transmit image data to a wireless reception antenna unit of the display panel in the form of wireless data.

Accordingly, when manufacturing a display device, a conventional configuration (for example, a flexible printed circuit board ("FPCB")) for physically connecting the PCB and the display panel may be omitted, and the manufacturing process time of the display device may be effectively reduced.

In addition, since the PCB and the display panel are not physically connected, the PCB may be easily separated from the display panel when the display device is subjected to reworking to reuse a part of the configuration of the display device. Accordingly, the time required for reworking may be reduced, and the PCB and the display panel may be substantially prevented from being damaged during reworking.

Accordingly, a driving chip for wirelessly receiving data or electric power from the PCB and driving the display panel is attached on the display panel in the manner of a chip-on-film ("COF"), a chip-on-glass ("COG"), or a chip-on-plastic ("COP").

Such a driving chip requires a driving element, e.g., a high capacity capacitor, and a volume of a space occupied by the driving element becomes a limiting factor for reducing the thickness of the portable display device.

Embodiments of the invention may be directed to a display device in which mechanical strength is ensured with a reduced thickness of the display device.

According to an embodiment, a display device includes: a display substrate in which a display area and a non-display area surrounding the display area are defined, where the display area includes a plurality of pixels; and a display driving chip disposed on the display substrate. In such an embodiment, the display substrate includes: a base substrate; a first conductive layer disposed on the base substrate; a first insulating layer disposed on the first conductive layer; and a second conductive layer disposed on the first insulating layer. In such an embodiment, the first conductive layer includes a first capacitor electrode disposed in the non-display area, and the second conductive layer includes a second capacitor electrode disposed in the non-display area. In such an embodiment, the first and second capacitor electrodes overlap each other with the first insulating layer therebetween and collectively define a first capacitor, and the first and second capacitor electrodes are connected to the display driving chip.

In an embodiment, a length of each of the first and second capacitor electrodes in a length direction of the non-display area may be greater than a length thereof in a width direction of the non-display area.

In an embodiment, the length of each of the first and second capacitor electrodes in the length direction of the non-display area is about five times or greater the length thereof in the width direction of the non-display area.

In an embodiment, the display substrate may further include a second insulating layer disposed on the second conductive layer, and the display driving chip may be disposed on the second insulating layer.

In an embodiment, the display driving chip may include a plurality of bumps disposed on one surface of the display driving chip which faces the second insulating layer. In such an embodiment, the first capacitor electrode may be connected to a first bump, and the second capacitor electrode may be connected to a second bump which is spaced apart from the first bump.

In an embodiment, the first conductive layer may further include a third capacitor electrode which is disposed in the non-display area and spaced apart from the first capacitor electrode. In such an embodiment, the second conductive layer may include a fourth capacitor electrode which is disposed in the non-display area and spaced apart from the second capacitor electrode. In such an embodiment, The third and fourth capacitor electrodes may overlap each other with the first insulating layer therebetween and collectively define a second capacitor In an embodiment, the first and third capacitor electrodes may be disposed along the length direction of the non-display area. In such an embodiment, the first and third capacitor electrodes may have different lengths from each other in the length direction of the non-display area and have a same length as each other in the width direction of the non-display area.

In an embodiment, the third capacitor electrode may be connected to the first bump, and the fourth capacitor electrode may be connected to the second bump.

In an embodiment, the third capacitor electrode may be connected to a third bump which is spaced apart from the first and second bumps, and the fourth capacitor electrode may be connected to a fourth bump that is spaced apart from the first, second and third bumps.

In an embodiment, one of the third and fourth capacitor electrodes may be connected to a fifth bump which is spaced apart from the first and second bumps, and the other of the third and fourth capacitor electrodes may be connected to one of the first and second bumps.

In an embodiment, a ground voltage may be applied to one of the first and second bumps.

In an embodiment, the display substrate may further include: a second insulating layer disposed on the second conductive layer; and a third conductive layer disposed on the second insulating layer. In such an embodiment, the third conductive layer may include a third capacitor electrode disposed in the non-display area, the second and third capacitor electrodes may overlap each other with the second insulating layer therebetween, and the third capacitor electrode may be connected to the first capacitor electrode.

In an embodiment, the display substrate may further include: a third insulating layer disposed on the third conductive layer; and a fourth conductive layer disposed on the third insulating layer. In such an embodiment, the fourth conductive layer may include a fourth capacitor electrode disposed the non-display area. In such an embodiment, the third and fourth capacitor electrodes may overlap each other with the fourth insulating layer therebetween, and the fourth capacitor electrode may be connected to the second capacitor electrode.

In an embodiment, the display device may further include a printed circuit board disposed on a rear surface of the display substrate. In such an embodiment, the printed circuit board may include a wireless transmission antenna, and the display substrate may include a wireless reception antenna disposed in the non-display area and coupled to the wireless transmission antenna.

In an embodiment, the wireless reception antenna may wirelessly receive an image data signal and a power from the wireless transmission antenna, and transmit the received image data signal and the received power to the display driving chip.

In an embodiment, at least one of the first and second conductive layers may include the wireless reception antenna.

In an embodiment, the wireless reception antenna may be connected to the first capacitor.

In an embodiment, the display driving chip may include a direct-current-to-direct-current ("DC-DC") converter, and the first capacitor may be connected to the DC-DC converter.

In an embodiment, the display driving chip may include a data driver, and the first capacitor may be connected to the data driver.

In an embodiment, the display driving chip may include a power supply unit, and the first capacitor may be connected to the power supply unit.

The foregoing is illustrative only and is not intended to be in any way limiting. In addition to the illustrative aspects, embodiments and features described above, further aspects, embodiments and features will become apparent by reference to the drawings and the following detailed description.

BRIEF DESCRIPTION OF THE DRAWINGS

A more complete appreciation of the invention will become more apparent by describing in detail embodiments thereof with reference to the accompanying drawings, in which.

DETAILED DESCRIPTION

Figure 1:
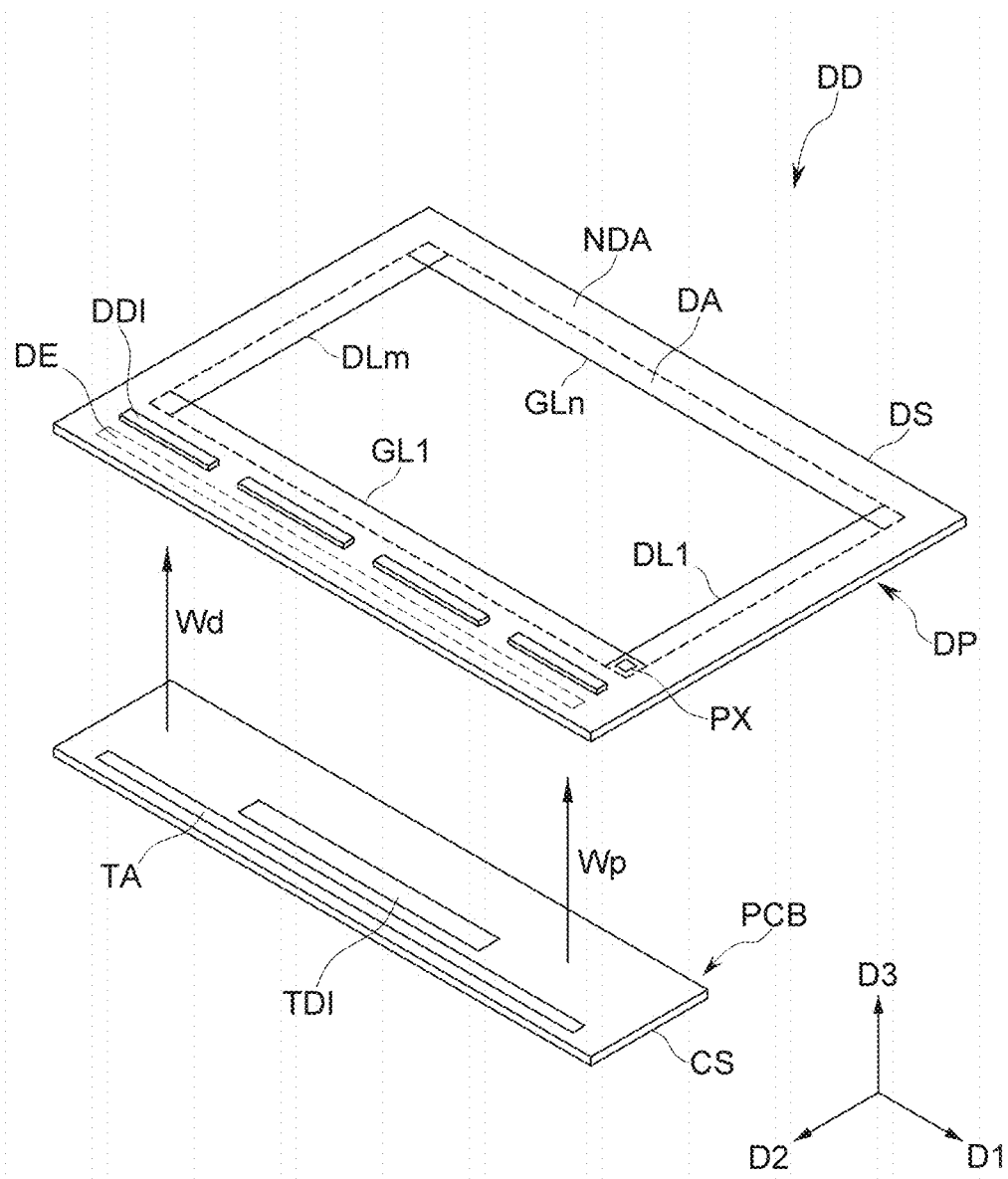
FIG. 1 is a schematic perspective view illustrating a display device according to an embodiment.

Embodiments will now be described more fully hereinafter with reference to the accompanying drawings. Although the invention may be modified in various manners and have several embodiments, embodiments are illustrated in the accompanying drawings and will be mainly described in the specification. However, the scope of the invention is not limited to the embodiments and should be construed as including all the changes, equivalents and substitutions included in the spirit and scope of the present invention.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least A and B" means "A and/or B." As used herein, the term "and/or" includes any and all combinations of one or more of the associated listed items.

The spatially relative terms "below", "beneath", "lower", "above", "upper" and the like, may be used herein for ease of description to describe the relations between one element or element and another element or element as illustrated in the drawings. It will be understood that the spatially relative terms are intended to encompass different orientations of the device in use or operation, in addition to the orientation illustrated in the drawings. For example, in a case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or elements, but do not preclude the presence or addition of one or more other features, integers, steps, operations, elements, elements, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of variation for the particular value as determined by one of ordinary skill in the art, considering the measurement in question and the error associated with measurement of the particular quantity (i.e., the limitations of the measurement system).

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined at the specification.

Some of the parts which are not associated with the description may not be provided in order to specifically describe embodiments of the invention and like reference numerals refer to like elements throughout the specification.

Herein, for convenience of description, embodiments where the display device is an organic light emitting diode ("OLED") display device will be described in detail, but embodiments are not limited thereto, and embodiments of the display device according to the invention may be applied to a liquid crystal display ("LCD") device or a plasma display panel ("PDP") device.

Hereinafter, embodiments of the invention will be described with reference to FIGS. 1 to 18.

FIG. 1 is a schematic perspective view illustrating a display device according to an embodiment.

Referring to FIG. 1, an embodiment of a display device DD includes a printed circuit board ("PCB") and a display panel DP that overlaps the PCB in a thickness direction thereof. The display panel DP includes a display substrate DS and a display driving chip (e.g., an integrated circuit chip) DDI disposed on the display substrate DS.

In an embodiment, the display panel DP may include a display area DA and a non-display area NDA. The display area DA may display images. The display area DA may include a plurality of pixels PX. In FIG. 1, only one pixel PX is shown, and the remaining pixels PX are omitted for convenience of illustration.

The non-display area NDA may not display images. A wiring, the display driving chip DDI, and a driving circuit element DE for driving the pixel PX may be disposed at the non-display area NDA. The non-display area NDA may surround the display area DA, for example. The non-display area NDA may define a bezel of the display device DD. The non-display area NDA has a length in a direction parallel to an edge of the display substrate DS and a width in a direction perpendicular to the length.

The display substrate DS includes gate lines GL1 to GLn, data lines DL1 to DLm, and pixels PX. The gate lines GL1 to GLn extend, for example, along a first direction D1 and are arranged along a second direction D2. The data lines DL1 to DLm insulatively intersect the gate lines GL1 to GLn. In one embodiment, for example, the data lines DL1 to DLm may extend along the second direction D2 and be arranged along the first direction D1. The first and second directions D1 and D2 may be, for example, perpendicular to each other. The thickness direction of the display substrate DS may be parallel to a third direction D3 that is perpendicular to the first and second directions D1 and D2.

Each of the pixels PX is connected to a corresponding one of the gate lines GL1 to GLn and a corresponding one of the data lines DL1 to DLm.

The pixels PX may be arranged in a matrix form along the first and second directions D1 and D2. The pixel PX is an element for displaying a unit image, and the resolution of the display panel DP may be determined based on the number of the pixels PX provided at the display panel DP.

The display panel DP may include the display substrate DS and the display driving chip DDI disposed on the display substrate DS. The display substrate DS may include the driving circuit element DE. The driving circuit element DE and the display driving chip DDI may be disposed at the non-display area NDA.

The driving circuit element DE includes a wireless reception antenna RA and a capacitor C (shown in FIG. 2) to be described below. The driving circuit element DE may include not only the capacitor C but also other passive elements, e.g., inductors, resistors and wirings.

The display driving chip DDI may be spaced apart from the display area DA in the second direction D2, for example. When viewed in a plan view in the thickness direction or the third direction DR3, the display driving chip DDI may be disposed between the driving circuit element DE and the display area DA.

The driving circuit element DE may be spaced apart from the display area DA in the second direction D2 and disposed along one end of the display substrate DS.

The PCB may include a circuit board CS and a transmission driving chip TDI disposed on the circuit board CS. The circuit board CS includes a wireless transmission antenna TA.

The transmission driving chip TDI may include, for example, a main processing unit of the display device DD. The main processing unit may control an overall operation of the display panel DP. The main processing unit receives input image signals input from the outside of the display device DD, and converts a data format of the input image signals according to an interface specification and a driving mode of the display driving chip DDI to generate input image data.

The wireless transmission antenna TA may be spaced apart from the transmission driving chip TDI in the second direction D2 and disposed along one end of the circuit board CS. The wireless transmission antenna TA may overlap the wireless reception antenna RA in the thickness direction or the third direction D3.

The wireless transmission antenna TA may receive the input image data and wirelessly transmit the input image data to the wireless reception antenna RA (shown in FIG. 2) as wireless data Wd.

The wireless reception antenna RA may receive the wireless data Wd and output the received wireless data Wd to the display driving chip DDI. The display driving chip DDI may convert the received wireless data Wd into restored image data, converts the restored image data into a data voltage, and outputs the data voltage to the pixel PX.

The wireless transmission antenna TA may wirelessly transmit a power Wp to the wireless reception antenna RA.

According to an embodiment, the wireless transmission antenna TA and the wireless reception antenna RA are not physically connected. In such an embodiment, a current path, through which a current directly flows, is not formed at the wireless transmission antenna TA and the wireless reception antenna RA.

In such an embodiment, since the wireless transmission antenna TA of the PCB may wirelessly transmit the image data Wd and the power Wp to the wireless reception antenna RA of the display panel DP, a conventional configuration for physically connecting the display panel DP with the PCB, e.g., a flexible printed circuit board ("FPCB"), may be omitted.

Accordingly, in such an embodiment, when manufacturing the display device DD, a process related to connection of the FPCB may be omitted, and the time of manufacturing the display device DD may be effectively reduced.

In such an embodiment, since the PCB and the display panel DP are not physically connected to each other, the PCB may be easily separated from the display panel DP when the display device DD is subjected to reworking to reuse a part of the configuration of the display device DD. Accordingly, the time used for reworking may be reduced, and the PCB and the display panel DP may be substantially prevented from being damaged during reworking.

In such an embodiment, circuit elements for the display driving chip DDI disposed on the display substrate DS, in particular, the wireless reception antenna RA and the capacitor C, may be formed into or defined by a metal layer of the display substrate DS. Accordingly, the driving circuit element DE for the display driving chip DDI may be formed only by the manufacturing process of the display substrate DS without a process of attaching additional circuit elements. Accordingly, a manufacturing process of the display panel DP, in which circuit elements are stably connected, is substantially simplified without increasing a thickness of the display panel DP.

Figure 2:
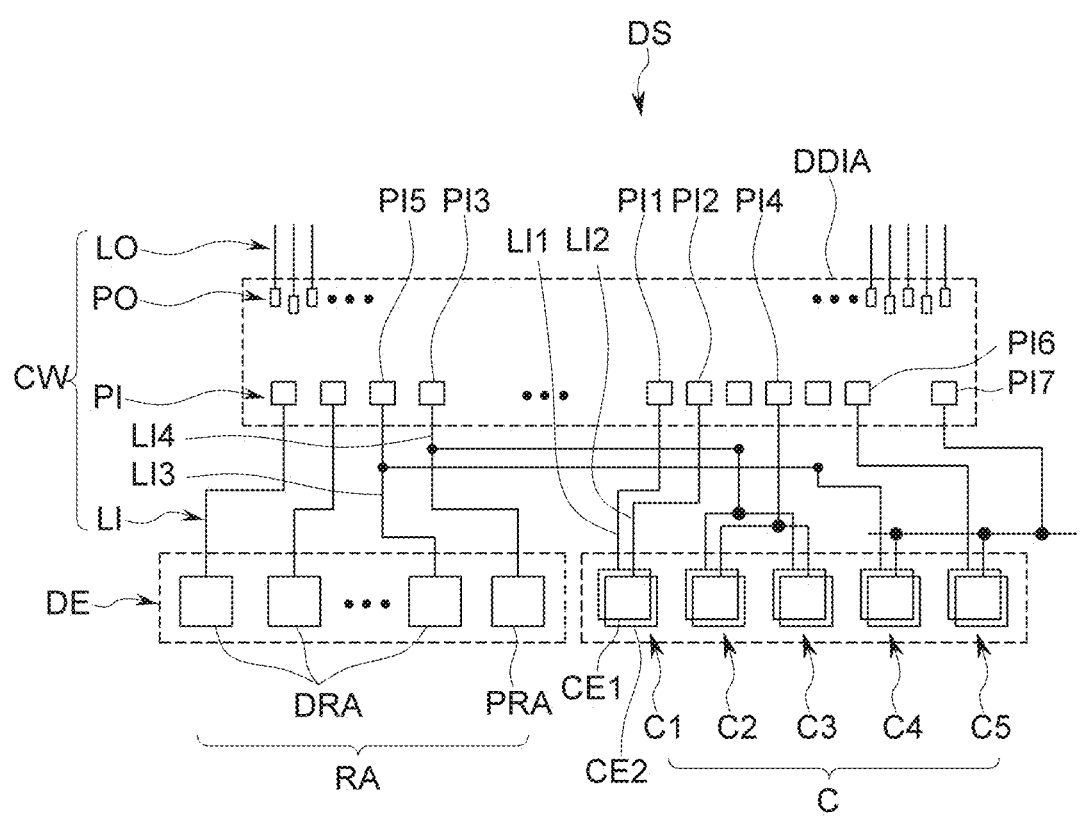
FIG. 2 is a plan view showing a portion of a display substrate according to an embodiment.
Figure 3:
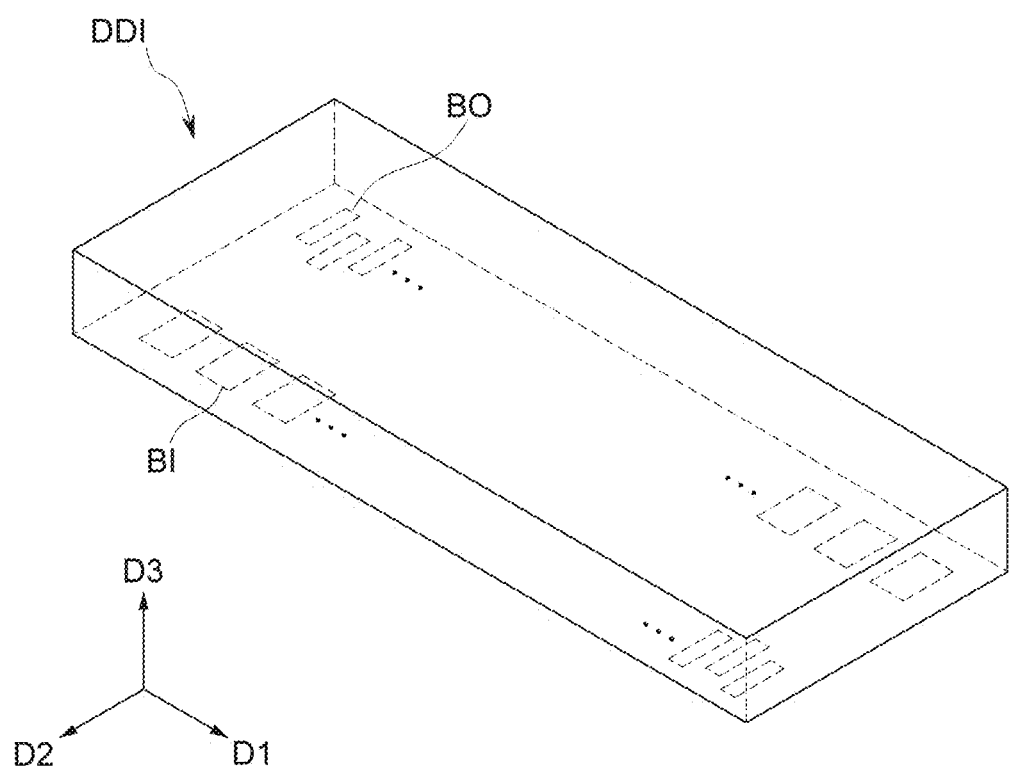
FIG. 3 is a perspective view illustrating a display driving chip according to an embodiment.

FIG. 2 is a plan view showing a portion of a display substrate according to an embodiment, and FIG. 3 is a perspective view illustrating a display driving chip according to an embodiment.

Referring to FIG. 2, the driving circuit element DE may include a plurality of reception antennas RA. The plurality of reception antennas RA may include a plurality of data reception antennas DRA and at least one power reception antenna PRA. The plurality of data reception antennas DRA and the power reception antenna PRA may be arranged along one end of the display substrate DS and arranged along the first direction D1.

The driving circuit element DE may include at least one capacitor C, e.g., capacitors C1, C2, C3, C4, and C5. Each of the capacitors C1, C2, C3, C4, and C5 may include a plurality of capacitor electrodes CE1 and CE2. In one embodiment, for example, each of the capacitors C1, C2, C3, C4, and C5 may include a first capacitor electrode CE1 disposed on a first conductive layer and a second capacitor electrode CE2 disposed on a second conductive layer. In such an embodiment, the first capacitor electrode CE1 and the second capacitor electrode CE2 may have same shape and size as each other, and may completely overlap each other when viewed in a plan view in the thickness direction. The plurality of capacitors C1, C2, C3, C4, and C5 are arranged along one end of the display substrate DS and arranged along the first direction D1.

Areas of the capacitor electrodes CE1 and CE2 of one of the capacitors C1, C2, C3, C4, and C5 may be substantially equal to or different from areas of the capacitor electrodes CE1 and CE2 of another of the capacitors C1, C2, C3, C4, and C5, respectively. Accordingly, each of the capacitors C1, C2, C3, C4, and C5 may have capacitances substantially equal to or different from each other.

In an embodiment, the display substrate DS may include a connection wiring CW. The connection wiring CW may electrically connect the driving circuit element DE and the display driving chip DDI, and may electrically connect the display driving chip DDI and the pixel PX. In such an embodiment, the connection wiring CW may electrically connect two or more driving circuit elements DE to each other.

The connection wiring CW includes connection pads PI and PO arranged at an area DDIA that overlaps the display driving chip DDI in a plan view. Herein, the phrase "in a plan view" may mean "when viewed from a plan view in the thickness direction." The connection pads PI and PO include an input side connection pad PI and an output side connection pad PO. The input side connection pad PI and an input side bump BI of the display driving chip DDI, illustrated in FIG. 3, overlap each other in a plan view, and are electrically connected to each other by an anisotropic conductive film therebetween. In such an embodiment, the output side connection pad PO and tan output side bump BO of the display driving chip DDI, illustrated in FIG. 3, overlap each other in a plan view, and are electrically connected to each other by an anisotropic conductive film therebetween.

In an embodiment, the connection wiring CW further includes an output side connection line LO that connects the output side connection pad PO and the pixel PX. The output side connection line LO may be or connected to the gate lines GL1 to GLn or the data lines DL1 to DLm. In such an embodiment, the output side connection line LO may be or connected to at least one power line that applies power to the pixel.

The connection wiring CW further includes an input side connection line LI that connects the input side connection pad PI and the driving circuit element DE.

In an embodiment, as described above, each of the capacitors C1, C2, C3, C4 and C5 includes the first capacitor electrode CE1 and the second capacitor electrode CE2. Each of the first capacitor electrodes CE1 of the capacitors C1, C2, C3, C4 and C5 is connected to a corresponding one of the input side connection pads PI through the input side connection lines LI1, and each of the second capacitor electrodes CE2 is connected to a corresponding one of the input side connection pads PI through the input side connection lines LI2, which will be described in detail below.

The first capacitor C1 is connected to two input side connection pads PI1 and PI2 of the display driving chip DDI. The input side connection line LI includes a first connection line LI1 that connects one input side connection pad PI1 and the first capacitor electrode CE1 of the first capacitor C1, and a second connection line LI2 that connects another input side connection pad PI2 and the second capacitor electrode CE2 of the first capacitor C1. The first capacitor electrode CE1 and the second capacitor electrode CE2 of the first capacitor C1 are connected to different input side connection pads PI1 and PI2 from each other.

In an embodiment, the second capacitor C2 and the third capacitor C3 may be connected in parallel. The first capacitor electrode CE1 of the second capacitor C2 and the first capacitor electrode CE1 of the third capacitor C3 may be connected to each other and connected to a same input side connection pad PI3. In such an embodiment, the second capacitor electrode CE2 of the second capacitor C2 and the second capacitor electrode CE2 of the third capacitor C3 may be connected to each other and connected to a same input side connection pad PI4. Three or more capacitors may be connected in parallel in such a manner.

The second capacitor C2 and the third capacitor C3 may be connected in parallel between two connection pads PI3 and PI4. The first capacitor electrode CE1 of the second capacitor C2 and the first capacitor electrode CE1 of the third capacitor C3 may be connected to each other and connected to one input side connection pad PI3. In such an embodiment, the second capacitor electrode CE2 of the second capacitor C2 and the second capacitor electrode CE2 of the third capacitor C3 may be connected to another input side connection pad PI4.

The fourth capacitor C4 and the fifth capacitor C5 may be connected to other two different connection pads PI5 and PI6, respectively, and connected to a common input side connection pad PI7. The first capacitor electrode CE1 of the fourth capacitor C4 is connected to one input side connection pad PI5, and the first capacitor electrode CE1 of the fifth capacitor C5 is connected to another input side connection pad PI6. In addition, the second capacitor electrode CE2 of the fourth capacitor C4 and the second capacitor electrode CE2 of the fifth capacitor C5 may be connected to each other and connected to a common input side connection pad PI7. Second capacitor electrodes CE2 of three or more capacitors C may be connected a common input side connection pad PI7.

In an embodiment, the input side connection line LI includes a connection line LI3 that connects the input side connection pad PI5 and the data reception antenna DRA, and a connection line LI4 that connects the input side connection pad PI3 and the power reception antenna PRA.

Each of the data reception antenna DRA and the power reception antenna PRA may be connected to the capacitor C. In one embodiment, for example, the first capacitor electrode CE1 of the fourth capacitor C4 and the data reception antenna DRA are connected to the input side connection pad PI5 connected to the data reception antenna DRA. In one embodiment, for example, the first capacitor electrode CE1 of the second capacitor C2, the first capacitor electrode CE1 of the third capacitor C3, and the power reception antenna PRA are connected to the input side connection pad PI3 connected to the power reception antenna PRA.

Figure 4:
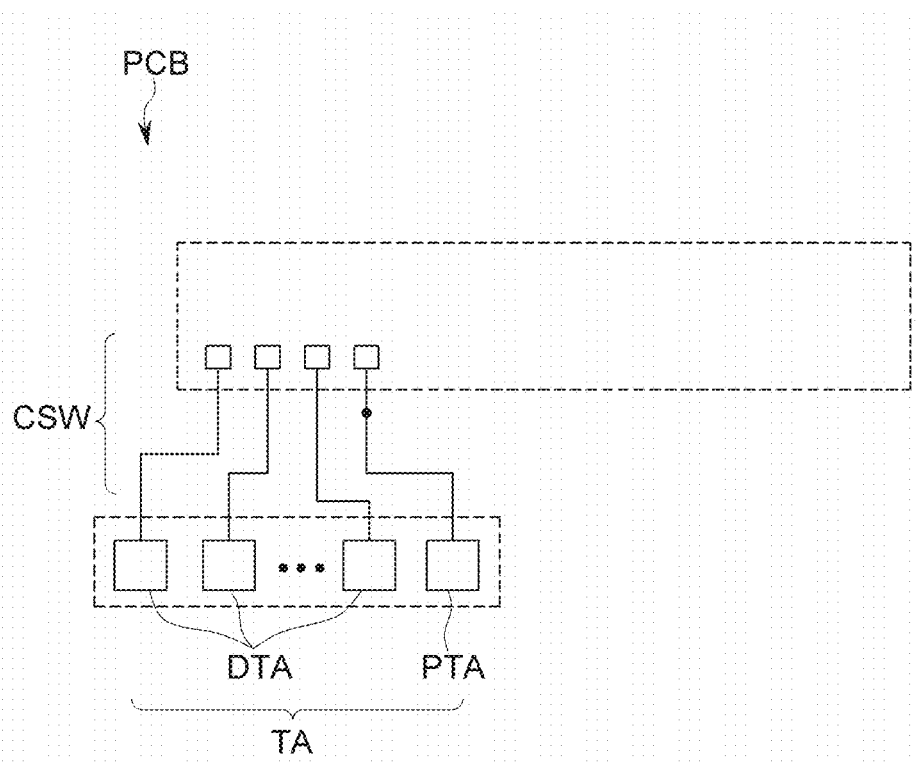
FIG. 4 is a plan view enlarging a portion of a printed circuit board ("PCB") according to an embodiment.

FIG. 4 is a plan view enlarging a portion of a printed circuit board ("PCB") according to an embodiment.

Referring to FIG. 4, an embodiment of the PCB may include the plurality of transmission antennas TA. The plurality of transmission antennas TA may include a plurality of data transmission antennas DTA and a power transmission antenna PTA. The plurality of data transmission antennas DTA and the power transmission antenna PTA are arranged along one end of the circuit board CS and arranged along the first direction D1.

The data transmission antennas DTA may overlap the data reception antennas DRA in the thickness direction, respectively, and may be coupled to the data reception antennas DRA, respectively.

The power transmission antenna PTA may overlap the power reception antenna PRA in the thickness direction, and may be coupled to the power reception antenna PRA.

The PCB may further include a circuit board wiring CSW. The circuit board wiring CSW may electrically connect the plurality of transmission antennas TA and the transmission driving chip TDI to each other.

Figure 5:
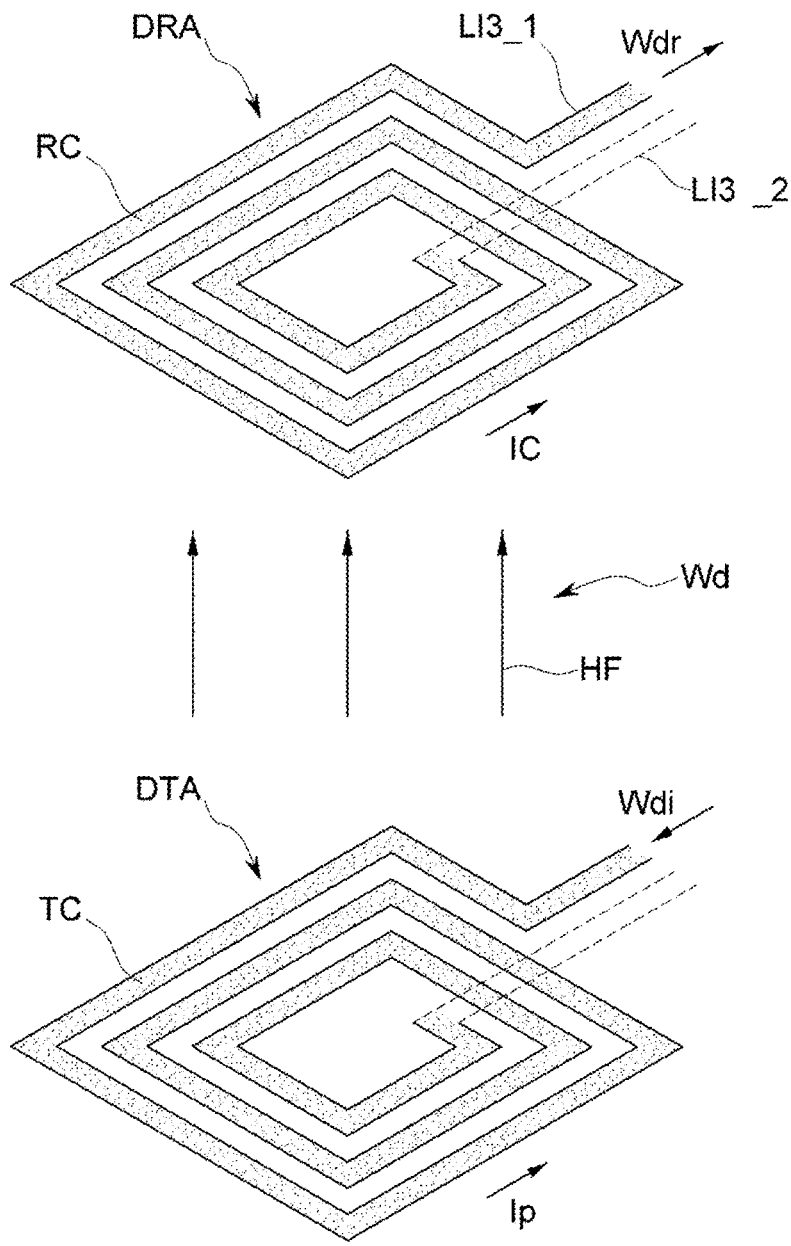
FIG. 5 is a perspective view illustrating a reception antenna and a transmission antenna according to an embodiment.

FIG. 5 is a perspective view illustrating a reception antenna and a transmission antenna according to an embodiment.

Each of the plurality of data transmission antennas DTA may have a shape substantially the same as a shape of the power transmission antenna PTA. In addition, each of the plurality of data reception antennas DRA may have a shape substantially the same as a shape of the power reception antenna PRA.

Referring to FIG. 5, in an embodiment, the data transmission antenna DTA may include a transmission coil TC, and the data reception antenna DRA may include a reception coil RC. The transmission coil TC and the reception coil RC may overlap each other in the thickness direction. The transmission coil TC may be disposed on the circuit board CS, and the reception coil RC may be disposed on the display substrate DS.

One end of the reception coil RC is connected to the input side bump BI of the display driving chip DDI through a connection line LI3_1. Another end of the reception coil RC may be connected to another input side bump BI of the display driving chip DDI through a connection line LI3_2.

As a data transmission signal Wdi is applied to the transmission coil TC, an antenna current Ip, which is an alternating current ("AC") type, flows in the transmission coil TC, and a magnetic field HF parallel to the thickness direction may be formed over the transmission coil TC. The magnetic field HF passes through the reception coil RC.

The magnetic field HF may change depending on the antenna current Ip. The magnetic field HF that varies may form the wireless data Wd. An induced current IC, which is an AC type, may be formed or induced in the reception coil RC by the varying magnetic field HF. The induced current IC may form a data reception signal Wdr.

Figure 6:
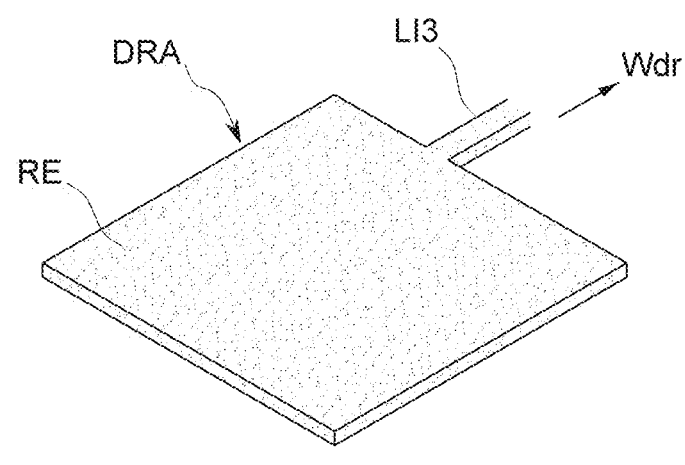
FIG. 6 is a perspective view illustrating a reception antenna and a transmission antenna according to an alternative embodiment.
Figure 6:
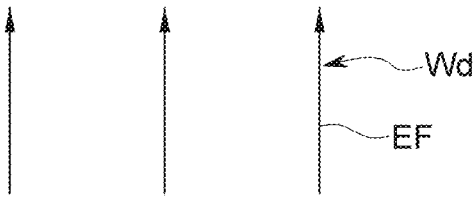
Figure 6:
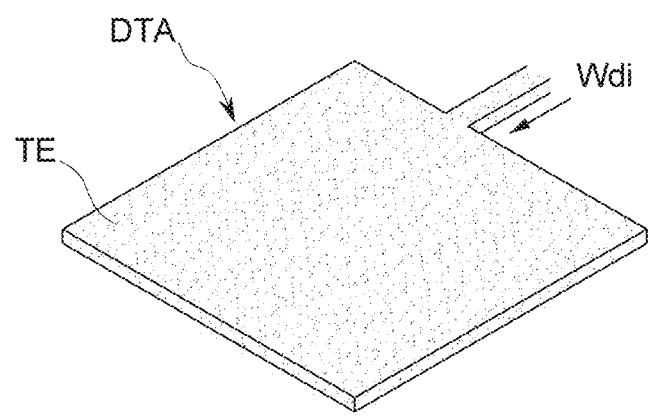

FIG. 6 is a perspective view illustrating a reception antenna and a transmission antenna according to an alternative embodiment.

Each of the plurality of data transmission antennas DTA may have a shape substantially the same as a shape of the power transmission antenna PTA. In addition, each of the plurality of data reception antennas DRA may have a shape substantially the same as a shape of the power reception antenna PRA.

Referring to FIG. 6, in an embodiment, the data transmission antenna DTA may include a transmission electrode TE, and the data reception antenna DRA may include a reception electrode RE. The transmission electrode TE and the reception electrode RE may overlap each other in the thickness direction. The transmission electrode TE may be disposed at the circuit board CS, and the reception electrode RE may be disposed at the display substrate DS.

The reception electrode RE is connected to the input side bump BI of the display driving chip DDI through the connection line LI3.

As the data transmission signal Wdi is applied to the transmission electrode 1E, an antenna voltage of an AC type is applied to the transmission electrode TE, and an electric field EF in parallel to the thickness direction may be formed between the transmission electrode TE and the reception electrode RE.

The electric field EF may vary depending on the antenna voltage. The varying electric field EF may form the wireless data Wd. An induced voltage may be formed or induced at the reception electrode RE by the varying electric field EF. The induced voltage may form the data reception signal Wdr.

Figure 7:
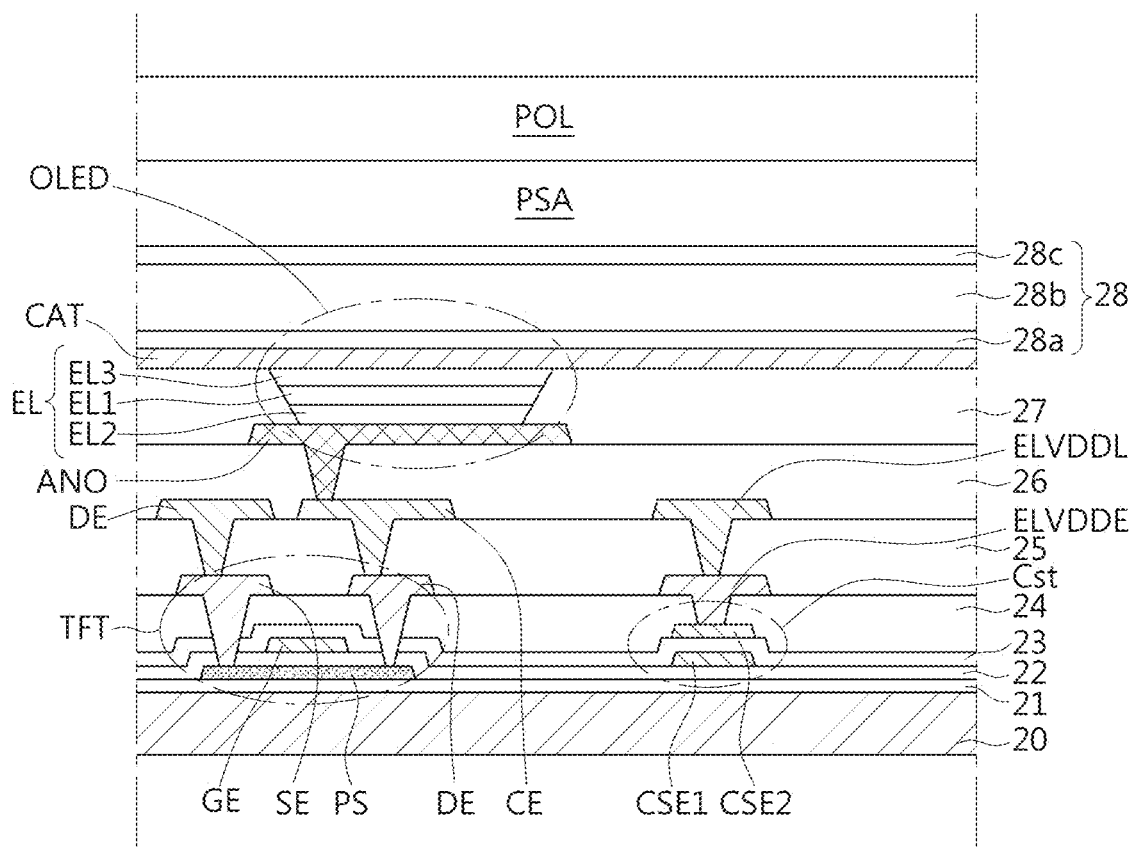
FIG. 7 is a cross-sectional view illustrating a display area of a display device according to an embodiment.

FIG. 7 is a cross-sectional view illustrating a display area of a display device according to an embodiment.

Referring to FIG. 7, an embodiment of the display device DD includes a display panel DP, which is, for example, an organic light-emitting diode ("OLED") display panel. The display panel DP includes the display substrate DS and a polarizing film POL disposed on the display substrate DS.

The pixel PX of the display substrate DS includes a thin film transistor ("TFT"), a storage capacitor Cst and an OLED that are disposed on a base substrate 20. The TFT includes a semiconductor layer PS, a gate electrode GE, a source electrode SE, and a drain electrode DE. The storage capacitor Cst includes a first electrode CSE1 and a second electrode CSE2. The OLED includes an anode electrode ANO, a cathode electrode CAT, and an organic layer EL disposed therebetween.

The base substrate 20 supports each layer disposed thereon. The base substrate 20 may include an insulating material. The base substrate 20 may include an inorganic material, e.g., glass and quartz, or may include an organic material, e.g., polyimide. The base substrate 20 may be a rigid substrate or a flexible substrate.

A buffer layer 21 is disposed on the base substrate 20. The buffer layer 21 may substantially prevent impurity ions from diffusing, substantially prevent penetration of moisture or outside air, and planarize a surface therebelow. The buffer layer 21 may include an insulating material and may include, for example, silicon nitride, silicon oxide, or silicon oxynitride.

In an embodiment, the semiconductor layer PS is disposed on the buffer layer 21. A channel of the TFT may be formed in the semiconductor layer PS. The semiconductor layer PS may include polycrystalline silicon. Impurity ions (p-type impurity ions in the case of a PMOS transistor) may be doped to portions (source/drain areas) of the semiconductor layer PS connected to source/drain electrodes SE and DE of the TFT. A trivalent dopant, e.g., boron (B), may be used as a p-type impurity ion. In an alternative embodiment, the semiconductor layer PS may include, for example, monocrystalline silicon, low temperature polycrystalline silicon, amorphous silicon, and oxide semiconductor, e.g., indium tin zinc oxide ("ITZO") and indium gallium zinc oxide ("IGZO").

A gate insulating layer 22 is disposed on the semiconductor layer PS.

In such an embodiment, a first gate conductive layer is disposed on the gate insulating layer 22. The first gate conductive layer includes the gate electrode GE of the TFT and the first electrode CSE1 of the storage capacitor Cst. In such an embodiment, the first gate conductive layer may include the gate lines GL1 to GLn for transmitting a scanning signal to the gate electrode GE.

A first insulating interlayer 23 is disposed on the first gate conductive layer.

Each of the gate insulating layer 22 and the first insulating interlayer 23 may include an inorganic material, e.g., silicon oxide, silicon nitride, or silicon oxynitride.

A second gate conductive layer is disposed on the first insulating interlayer 23. The second gate conductive layer may include the second electrode CSE2 of the storage capacitor Cst. The first electrode CSE1 and the second electrode CSE2 may form the storage capacitor Cst that includes the first insulating interlayer 23 as a dielectric layer.

Each of the first gate conductive layer and the second gate conductive layer may include a metal, e.g., at least one selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). Each of the first gate conductive layer and the second gate conductive layer may be a single film (e.g., have a single layer structure) or a multilayer film (e.g., have a multilayer structure).

A second insulating interlayer 24 is disposed on the second gate conductive layer. In such an embodiment, the second insulating interlayer 24 may include an organic layer including an organic material, or an inorganic layer.

A first source/drain conductive layer is disposed on the second insulating interlayer 24. The first source/drain conductive layer may include a source electrode SE and a drain electrode DE of the TFT, and a power voltage electrode ELVDDE. The source electrode SE and the drain electrode DE of the TFT may be electrically connected to a soured area and a drain area of the semiconductor layer PS through a contact hole defined through the second insulating interlayer 24, the first insulating interlayer 23 and the gate insulating layer 22.

A first via layer 25 is disposed on the first source/drain conductive layer.

A second source/drain conductive layer is disposed on the first via layer 25. The second source/drain conductive layer may include data lines DL1 to DLm, the connection electrode CE, and a power voltage line ELVDDL.

The data lines DL1 to DLm may be electrically connected to the source electrode SE of the TFT through a contact hole defined through the first via layer 25. The connection electrode CE may be electrically connected to the drain electrode DE of the TFT through a contact hole defined through the first via layer 25. The power voltage line ELVDDL may be electrically connected to the power voltage electrode ELVDDE through a contact hole defined through the first via layer 25.

Each of the first source/drain conductive layer and the second source/drain conductive layer may include a metal, e.g., at least one selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). Each of the first source/drain conductive layer and the second source/drain conductive layer may be a single film or a multilayer film.

A second via layer 26 is disposed on the second source/drain conductive layer. The first via layer 25 and the second via layer 26 described above may be an organic layer including an organic insulating material.

The anode electrode ANO is disposed on the second via layer 26. The anode electrode ANO is connected to the connection electrode CE through a contact hole defined through the second via layer 26, and may be electrically connected to the drain electrode DE of the TFT through the contact hole.

A pixel defining layer 27 may be disposed on the anode electrode ANO. The pixel defining layer 27 may include an opening that exposes the anode electrode ANO. The pixel defining layer 27 may include an organic insulating material or an inorganic insulating material.

The organic layer EL is disposed in the opening of the pixel defining layer 27. The organic layer EL may include an organic light emitting layer EL1, a hole injecting/transporting layer EL2, and an electron injecting/transporting layer EL3. In an embodiment, as shown in FIG. 7, each of the hole injecting/transporting layer EL2 and the electron injecting/transporting layer EL3 may be a single layer, but not limited thereto. Alternatively, a plurality of layers that includes an injecting layer and a transporting layer may be stacked one on another. At least one of the hole injecting/transporting layer EL2 and the electron injecting/transporting layer EL3 may be a common layer disposed entirely over a plurality of pixels.

The cathode electrode CAT is disposed on the organic layer EL and the pixel defining layer 27. The cathode electrode CAT may be a common electrode disposed entirely over a plurality of pixels.

A passivation layer 28 may be disposed on the cathode electrode CAT. The passivation layer 28 includes an inorganic material. The passivation layer 28 may include a plurality of stacked films. In one embodiment, for example, the passivation layer 28 may include a first inorganic material layer 28*a*, an organic material layer 28*b*, and a second inorganic material layer 28*c* that are sequentially stacked one on another.

An adhesive layer (e.g., a pressure sensitive adhesive) PSA may be disposed on the passivation layer 28, and a polarizing film POL may be disposed on the adhesive layer PSA.

Figure 8:
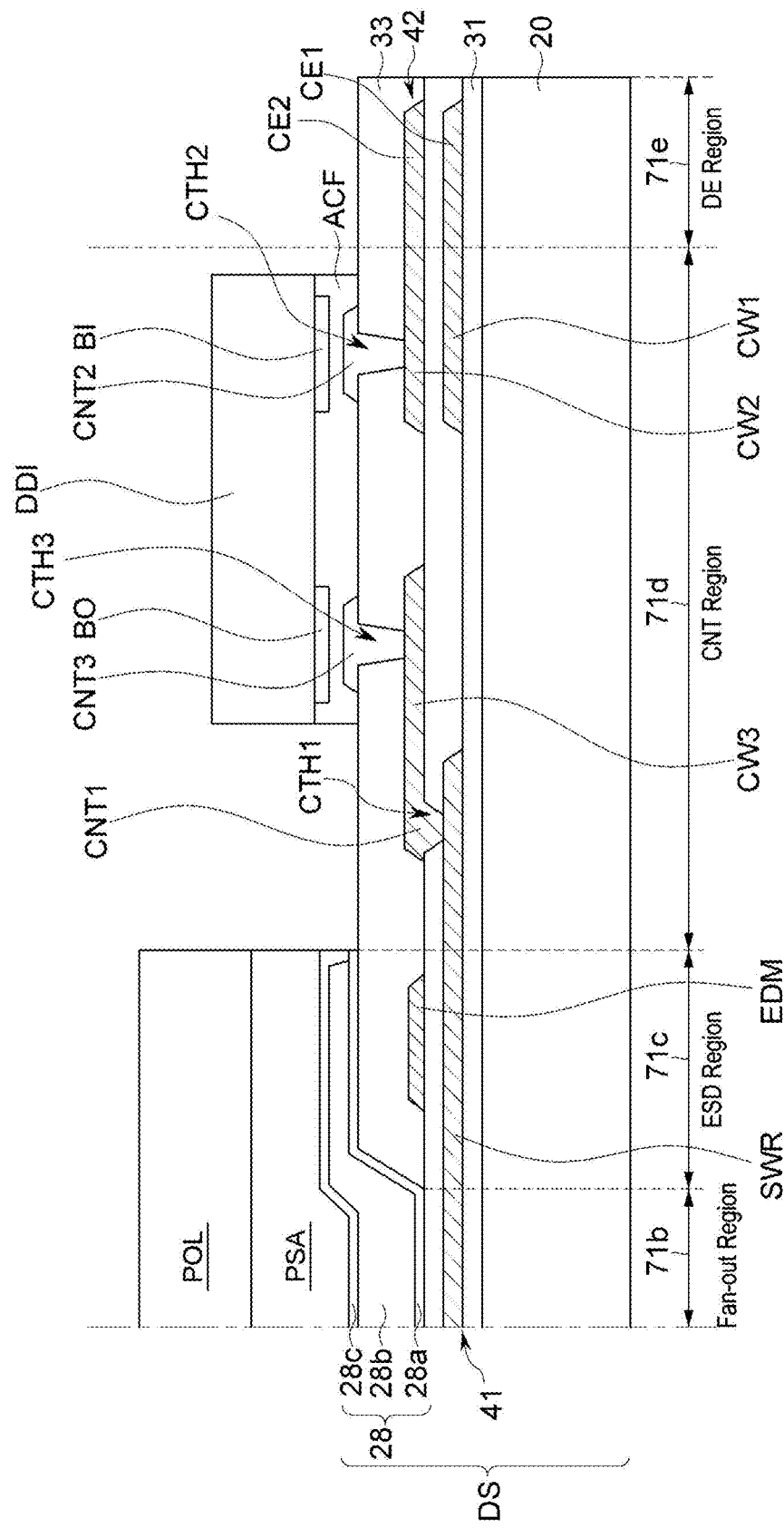
FIG. 8 is a cross-sectional view illustrating a non-display area of a display device according to an embodiment.

FIG. 8 is a cross-sectional view illustrating a non-display area of a display device according to an embodiment.

FIG. 8 is a schematic cross-sectional view illustrating the non-display area of the OLED display panel of FIG. 7. In the cross-sectional view of FIG. 8, the insulating layer and the conductive layer shown in FIG. 7 are simplified for convenience of illustration.

Referring to FIGS. 7 and 8, a first insulating layer 31, a first conductive layer 41, a second insulating layer 32, a second conductive layer 42, and a third insulating layer 33 are sequentially disposed on the base substrate 20. The first conductive layer 41 and the second conductive layer 42 may be electrically connected to each other through a contact CNT1.

The first conductive layer 41 and the second conductive layer 42 may be disposed in different layers from each other, and the second conductive layer 42 may be disposed above the first conductive layer 41. The first conductive layer 41 may include one of the first gate conductive layer, the second gate conductive layer, the first source/drain conductive layer and the second source/drain conductive layer in FIG. 7, and the second conductive layer 42 may include another of the first gate conductive layer, the second gate conductive layer, the first source/drain conductive layer and the second source/drain conductive layer in FIG. 7. In an embodiment, where the first conductive layer 41 includes the first gate conductive layer and the second conductive layer 42 includes the first source/drain conductive layer, the first insulating layer 31 may include the buffer layer 21, the gate insulating layer 22 and the first insulating interlayer 23 shown in FIG. 7, the second insulating layer 32 may include the second insulating interlayer 24 shown in FIG. 7, and the third insulating layer 33 may include the first via layer 25, the second via layer 26 and the pixel defining layer 27 shown in FIG. 7.

The first insulating layer 31 may be disposed on the base substrate 20, and may be disposed over a fan-out region or area 71*b*, a static electricity dispersion region or area 71*c* (referred to as ESD Region in FIG. 8), a wiring contact region or area 71*d* (referred to as CNT Region in FIG. 8), and a driving circuit element region or area 71*e* (referred to as DE Region in FIG. 8), which are defined on the based substrate 20.

The first conductive layer 41 includes a signal wiring SWR. The signal wiring SWR may extend from the fan-out region 71*b* to the wiring contact region 71*d* through the static electricity dispersion region 71*c*.

The first conductive layer 41 includes the driving circuit element DE and a first connection wiring CW1. The first conductive layer 41 may further include the reception antenna RA illustrated in FIG. 2. In such an embodiment, the first conductive layer 41 may further include the first capacitor electrode CE1 of the capacitor C, and the input side connection line LI1 connected to the first capacitor electrode CE1, illustrated in FIG. 2.

The second insulating layer 32 may cover the first conductive layer 41.

The second conductive layer 42 is disposed on the first insulating layer 31.

The second conductive layer 42 includes the driving circuit element DE and a second connection wiring CW2. The second conductive layer 42 may further include the reception antenna RA illustrated in FIG. 2. In such an embodiment, the second conductive layer 42 may further include the second capacitor electrode CE2 of the capacitor C, and the second connection wiring CW2 connected to the second capacitor electrode CE2, illustrated in FIG. 2. The second connection wiring CW2 may further include the input side connection pad PI and the input side connection line LI illustrated in FIG. 2.

The second conductive layer 42 includes a third connection wiring CW3. The third connection wiring CW3 includes the output side connection pad PO and the output side connection line LO illustrated in FIG. 2. The third connection interconnection CW3 is disposed to partially overlap the first conductive layer 41 at the wiring contact region 71*d* and is electrically connected to the first conductive layer 41 through the contact CNT1 disposed at a contact hole CTH1 defined through the second insulating layer 32.

The second conductive layer 42 may also be disposed at the static electricity dispersion region 71*c* (see EDM), and may form a static electricity dispersion circuit together with the first conductive layer 41.

The third insulating layer 33 is disposed covering the second conductive layer 42. Although it is exemplified in the drawing that the third insulating layer 33 is disposed at the static electricity dispersion region 71*c* and the wiring contact region 71*d*, and is not disposed at the fan-out region 71*b*, embodiments are not limited thereto. In an embodiment, the third insulating layer 33 may also be disposed at the fan-out region 71*b*.

The passivation layer 28 is disposed on the third insulating layer 33. The passivation layer 28 may include the first inorganic material layer 28*a*, the organic material layer 28*b*, and the second inorganic material layer 28c. In such an embodiment, as shown in FIG. 8, a side surface of the organic material layer 28b may be covered by the second inorganic material layer 28c.

The passivation layer 28 may cover the display area DA and may extend to the non-display area NDA adjacent to a lower edge of the display area DA to cover the fan-out region 71b and the static electricity dispersion region 71c. In a plan view, a lower edge of the passivation layer 28 may be located between the static electricity dispersion region 71c and the wiring contact region 71d. Although it is exemplified in the drawing that a side surface of the lower edge of the passivation layer 28 is located at a boundary between the static electricity dispersion region 71c and the wiring contact region 71d, embodiments are not limited thereto. In an embodiment, the side surface of the lower edge of the passivation layer 28 may be located on the static electricity dispersion region 71c or on the wiring contact region 71d.

In an embodiment, an adhesive layer PSA and a polarizing film POL are disposed on the passivation layer 28. In an embodiment, a lower edge of the polarizing film POL and a lower edge of the adhesive layer PSA may be aligned with the lower edge of the passivation layer 28 in a plan view as shown in FIG. 8.

The display driving chip DDI may be disposed on the third insulating layer 33 of the wiring contact region 71d that is not covered by the passivation layer 28. The output side bump BO and the input side bump BI illustrated in FIG. 3 are arranged on a bottom surface of the display driving chip DDI.

The input side bump BI is disposed overlapping the input side connection pad PI of the second connection wiring CW2 at the wiring contact region 71d. The input side bump BI is electrically connected to the second connection wiring CW2 via a contact CNT2 disposed at a contact hole CTH2 defined through the third insulating layer 33.

The output side bump BO is disposed overlapping the output side connection pad PO of the third connection wiring CW3 at the wiring contact region 71d. The output side bump BO is electrically connected to the third connection wiring CW3 through a contact CNT3 that is defined at a contact hole CTH3 defined through the third insulating layer 33.

An anisotropic conductive film ACF is disposed between the display driving chip DDI and the display substrate DS, and the bumps BI and BO of the display driving chip DDI are electrically connected to the contacts CNT2 and CNT3, respectively. Alternatively, without the contacts CNT2 and CNT3, the bumps BI and BO of the display driving chip DDI may be connected to portions of the connection pads PI and PO that are exposed by the contact holes CTH2 and CTH3 by anisotropic conductive films ACF, respectively.

Figure 9:
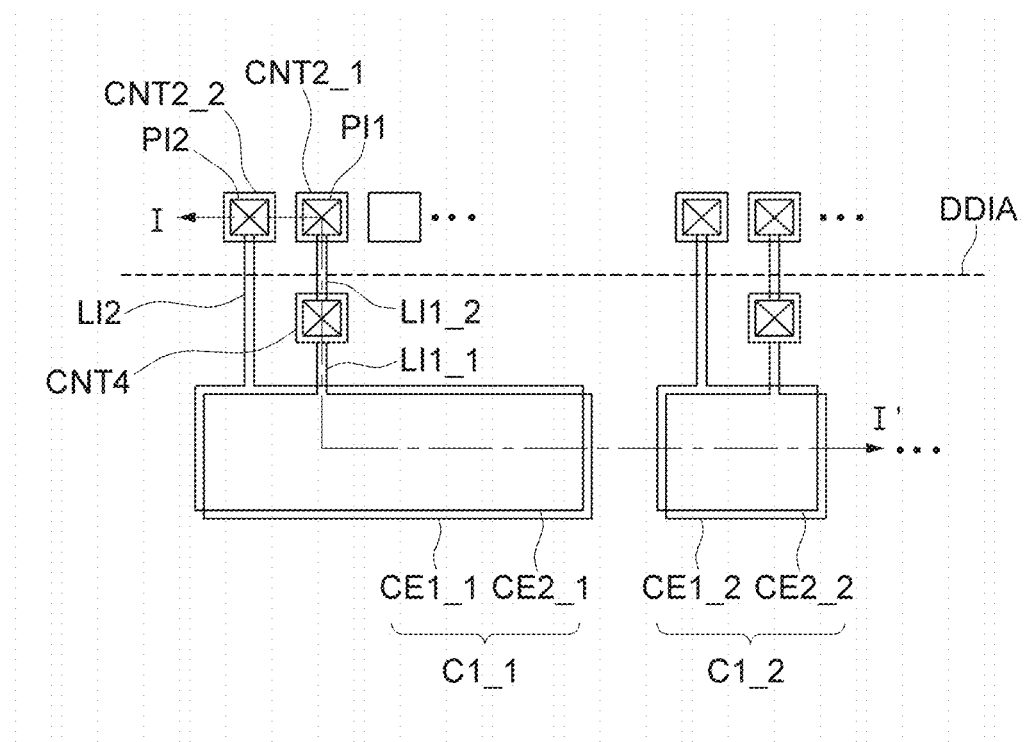
FIG. 9 is a plan view illustrating a capacitor according to an embodiment.
Figure 10:
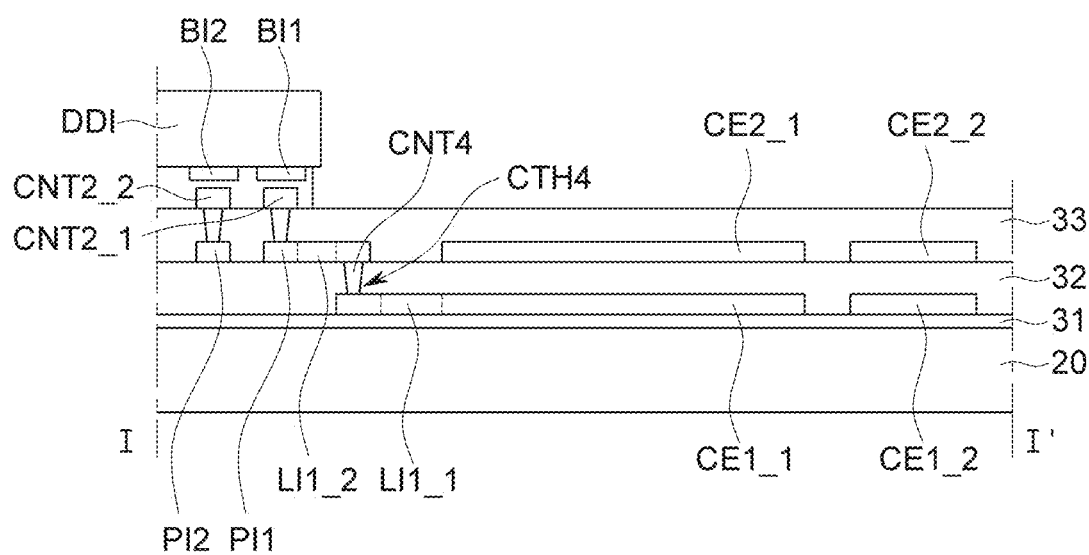
FIG. 10 is a cross-sectional view taken along line I-I' in FIG. 9.

FIG. 9 is a plan view illustrating a capacitor according to an embodiment, and FIG. 10 is a cross-sectional view taken along line I-I' in FIG. 9.

Referring to FIGS. 9 and 10, in an embodiment, a first capacitor C1 includes a first capacitor electrode CE1_1 disposed on the first insulating layer 31 and a first capacitor electrode CE1_2 disposed on the second insulating layer 32. The first capacitor electrode CE1_1 is defined by a portion of the first conductive layer 41 of FIG. 8, and the second capacitor electrode CE2_1 is defined by a portion of the second conductive layer 42 of FIG. 8.

The first capacitor electrode CE1_1 and the second capacitor electrode CE2_1 overlap each other in the thickness direction with the second insulating layer 32 therebetween. The first capacitor electrode CE1_1 and the second capacitor electrode CE2_1 are electrically insulated from each other. The first capacitor C1 has a capacitance that is determined by an overlapping area between the first capacitor electrode CE1_1 and the second capacitor electrode CE2_1, a distance between the first capacitor electrode CE1_1 and the second capacitor electrode CE2_1, and a dielectric constant of the second insulating layer 32.

The first capacitor electrode CE1_1 is connected to a first input side bump BI1 of the display driving chip DDI, and the second capacitor electrode CE2_1 is connected to a second input side bump BI2 of the display driving chip DDI. The first and second input side bumps BI1 and BI2 may be connected to various circuits in the display driving chip DDI to be described below.

A first connection line LI1_1 is disposed on the first insulating layer 31. One end of the first connection line LI1_1 is connected to the first capacitor electrode CE1_1, and another end thereof includes a pad exposed by a contact hole CTH4 defined through the second insulating layer 32.

A second connection line LI1_2 is disposed on the second insulation layer 32. One end of the second connection line LI1_2 is connected to the first input side connection pad PI1, and another end thereof is connected to a pad of the first connection line LI1_1 by a contact CNT4 disposed at the contact hole CTH4. The first input side connection pad PI1 is connected to the first input side bump BI1 through a first contact CNT2_1 disposed at a contact hole defined through the third insulating layer 33.

A third connection line LI2 is disposed on the second insulating layer 32. One end of the third connection line LI2 is connected to the second input side connection pad PI2 through a second contact CNT2_2, and another end thereof is connected to the second capacitor electrode CE2_1.

Referring to FIGS. 9 and 10, an embodiment of the display substrate DS includes a first capacitor C1 and a second capacitor C2. Each of the first and second capacitor electrodes CE1_1, CE1_2, CE2_1, and CE2_2 of the first and second capacitors C1 and C2 may be connected to different input side bumps BI.

The first capacitor electrodes CE1_1 and CE1_2 and the second capacitor electrodes CE2_1 and CE2_2 of the first and second capacitors C1 and C2 overlap each other with the same shape and size as each other.

A length of each of the first capacitor electrode CE1_1 and the second capacitor electrode CE2_1 in a length direction of the non-display area, i.e., in a direction D1 parallel to an adjacent edge of the display substrate DS, may be greater than a length thereof in a width direction D2 thereof. The length of each of the first capacitor electrode CE1_1 and the second capacitor electrode CE2_1 may be two, five, or ten times greater than the length thereof.

The first capacitor electrode CE1_1 of the first capacitor C1 may have an area substantially equal to or different from an area of the first capacitor electrode CE1_2 of the second capacitor C2. In one embodiment, for example, the first capacitor electrode CE1_1 of the first capacitor C1 and the first capacitor electrode CE1_2 of the second capacitor C2 may have different lengths in the length direction D1 parallel to an adjacent edge of the display substrate DS, and may have a substantially same length in the width direction D2 perpendicular to the adjacent edge.

Figure 11:
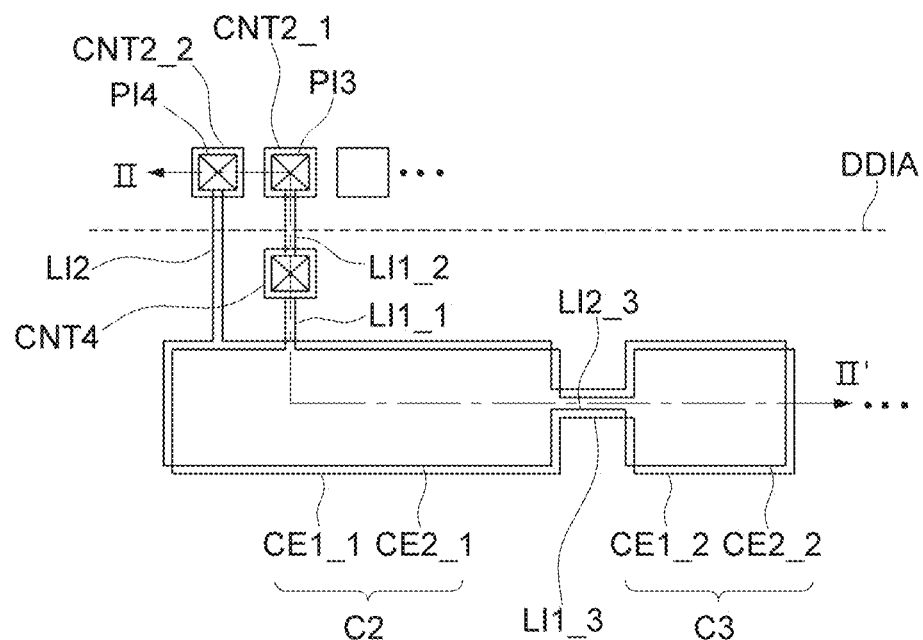
FIG. 11 is a plan view illustrating a capacitor according to an embodiment.
Figure 12:
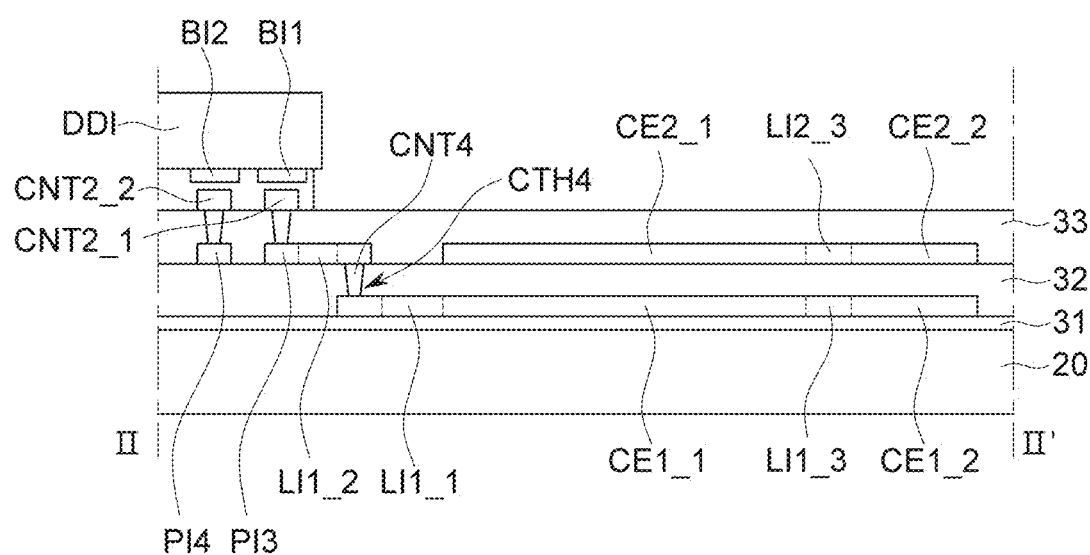
FIG. 12 is a cross-sectional view taken along line II-II' in FIG. 11.

FIG. 11 is a plan view illustrating a capacitor according to an embodiment, and FIG. 12 is a cross-sectional view taken along line II-II' in FIG. 11.

Referring to FIGS. 11 and 12, an embodiment of the display substrate DS includes a second capacitor C2 and a third capacitor C3. The second capacitor C2 and the third capacitor C3 are connected in parallel to each other between the first and second input side bumps BI1 and BI2.

A connection structure of the second capacitor C2 and the first and second input side bumps BI1 and BI2 is substantially the same as that of the first capacitor C1 illustrated in FIGS. 9 and 10, and any repetitive detailed description thereof will be omitted.

The second capacitor C2 includes a first capacitor electrode CE1_1 disposed on the first insulating layer 31 and a second capacitor electrode CE2_1 disposed on the second insulating layer 32. The third capacitor C3 includes a first capacitor electrode CE1_2 disposed on the first insulating layer 31 and a second capacitor electrode CE2_2 disposed on the second insulating layer 32.

The first capacitor electrode CE1_1 of the second capacitor C2 and the first capacitor electrode CE1_2 of the third capacitor C3 are connected to each other by a fourth connection line LI1_3 disposed on the first insulation layer 31. The second capacitor electrode CE2_1 of the second capacitor C2 and the second capacitor electrode CE2_2 of the third capacitor C3 are connected to each other by a fifth connection line LI2_3 disposed on the second insulation layer 32.

Accordingly, a capacitance between the first and second input side bumps BI1 and BI2 from the display driving chip DDI is substantially equal to a sum of a capacitance of the second capacitor C2 and a capacitance of the third capacitor C3.

In an embodiment, as shown in FIGS. 11 and 12, the second capacitor C2 and the third capacitor C3 are directly connected to each other, and the second capacitor C2 is connected to the first and second input side bumps BI1 and BI2, embodiments are not limited thereto. In an alternative embodiment, similar to the capacitors C2 and C3 illustrated in FIG. 2, the fourth connection line LI1_3 may connect the first capacitor electrode CE1_2 of the third capacitor C3 and the first connection line LI1_1, and the fifth connection line LI2_3 may connect the second capacitor electrode CE2_2 of the third capacitor C3 and the third connection line LI2.

Figure 13:
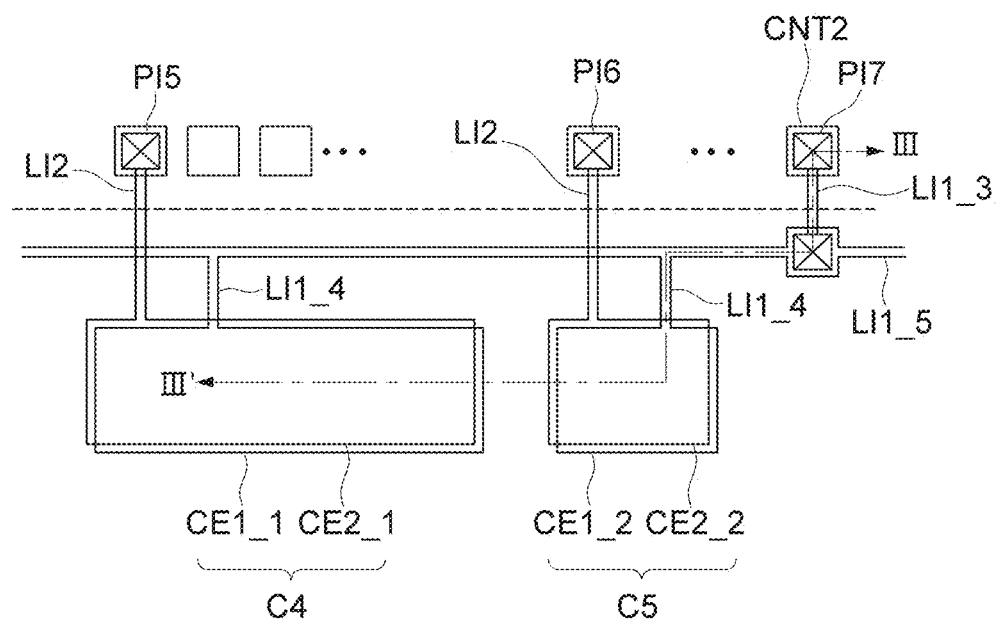
FIG. 13 is a plan view illustrating a capacitor according to an embodiment.
Figure 14:
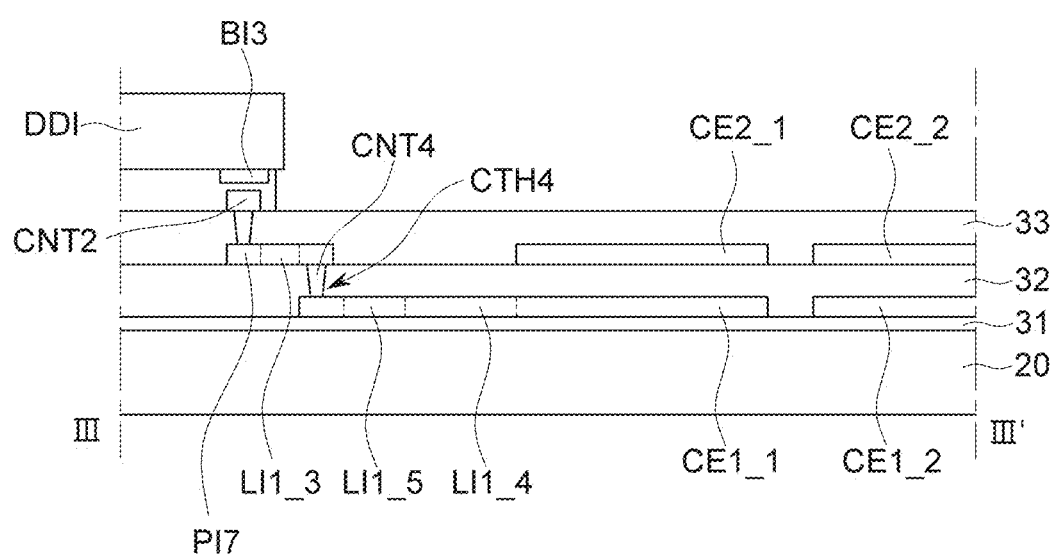
FIG. 14 is a cross-sectional view taken along line in FIG. 13.

FIG. 13 is a plan view illustrating a capacitor according to an embodiment, and FIG. 14 is a cross-sectional view taken along line in FIG. 13.

Referring to FIGS. 13 and 14, the display substrate DS according to an embodiment includes a fourth capacitor C4 and a fifth capacitor C5. The fourth capacitor C4 and the fifth capacitor C5 are connected to a common input side bump BI3. The common input side bump BI3 may be grounded.

The fourth capacitor C4 includes a first capacitor electrode CE1_1 disposed on the first insulating layer 31 and a second capacitor electrode CE2_1 disposed on the second insulating layer 32. The fifth capacitor C5 includes a first capacitor electrode CE1_2 disposed on the first insulating layer 31 and a second capacitor electrode CE2_2 disposed on the second insulating layer 32.

The second capacitor electrode CE2_1 of the fourth capacitor C4 and the second capacitor electrode CE2_2 of the fifth capacitor C5 are connected to the input side connection pads PI5 and PI6, respectively, through the third connection line LI2 disposed on the second insulating layer 32, and the input side connection pads PI5 and PI6 are connected to different input side bumps BI, respectively, through the contact CNT2.

The first capacitor electrode CE1_1 of the fourth capacitor C4 and the first capacitor electrode CE1_2 of the fifth capacitor C5 are connected to a common input side bump BI3.

A sixth connection line LI1_3 is disposed on the second insulating layer 32. One end of the sixth connection line LI1_3 is connected to the common input side connection pad PI7, and another end thereof is connected to a pad of a seventh connection line LI1_5 by the contact CNT4 defined at the contact hole CTH4. The common input side connection pad PI7 is connected to the common input side bump BI3 through the contact CNT2 defined at a contact hole.

The seventh connection line LI1_5 is disposed on the first insulating layer 31. The seventh connection line LI1_5 extends along between the display driving chip area DDIA and the first capacitor electrodes CE1_1 and CE1_2. The seventh connection line LI1_5 may extend in a direction D1 parallel to an edge of the display substrate DS.

An eighth connection line LI1_4 is disposed on the first insulating layer 31. One end of the eighth connection line LI1_4 is connected to each of the first capacitor electrodes CE1_1 and CE1_2 of the fourth and fifth capacitors C4 and C5, and another end thereof is connected to the seventh connection line LI1_5.

Figure 15:
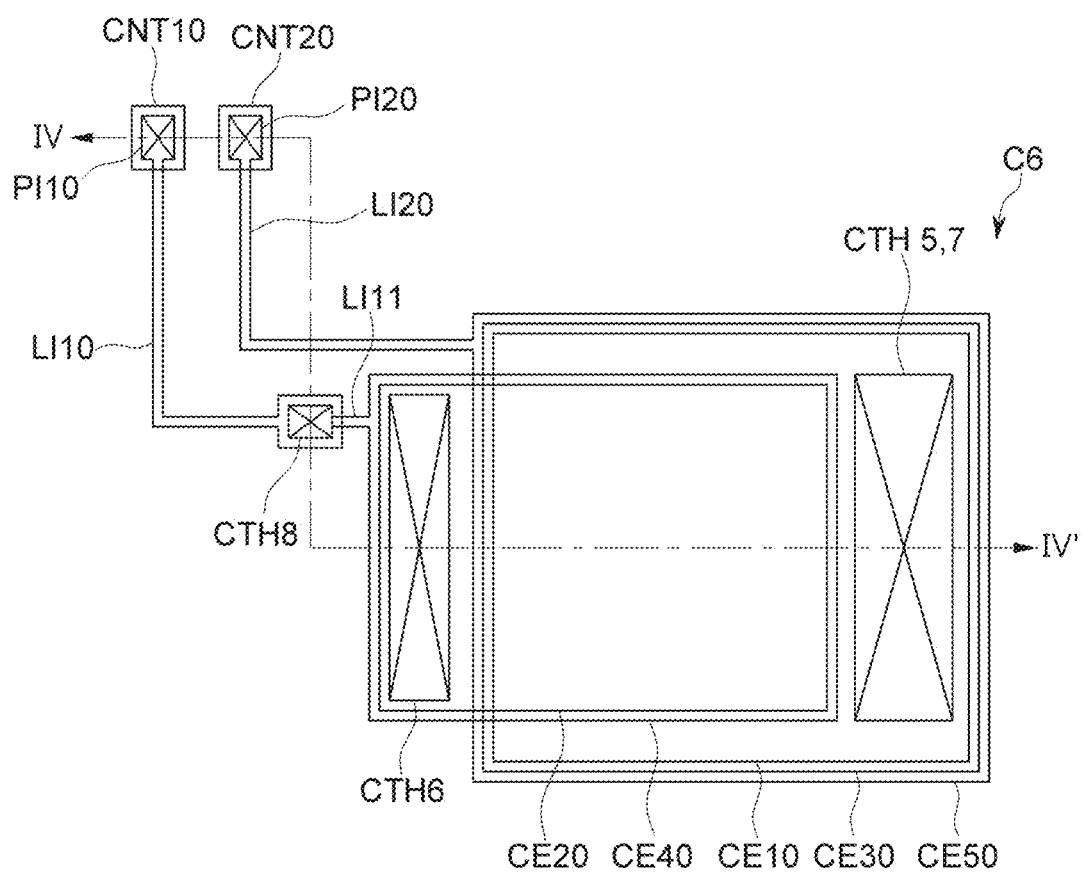
FIG. 15 is a plan view illustrating a capacitor according to an embodiment.
Figure 16:
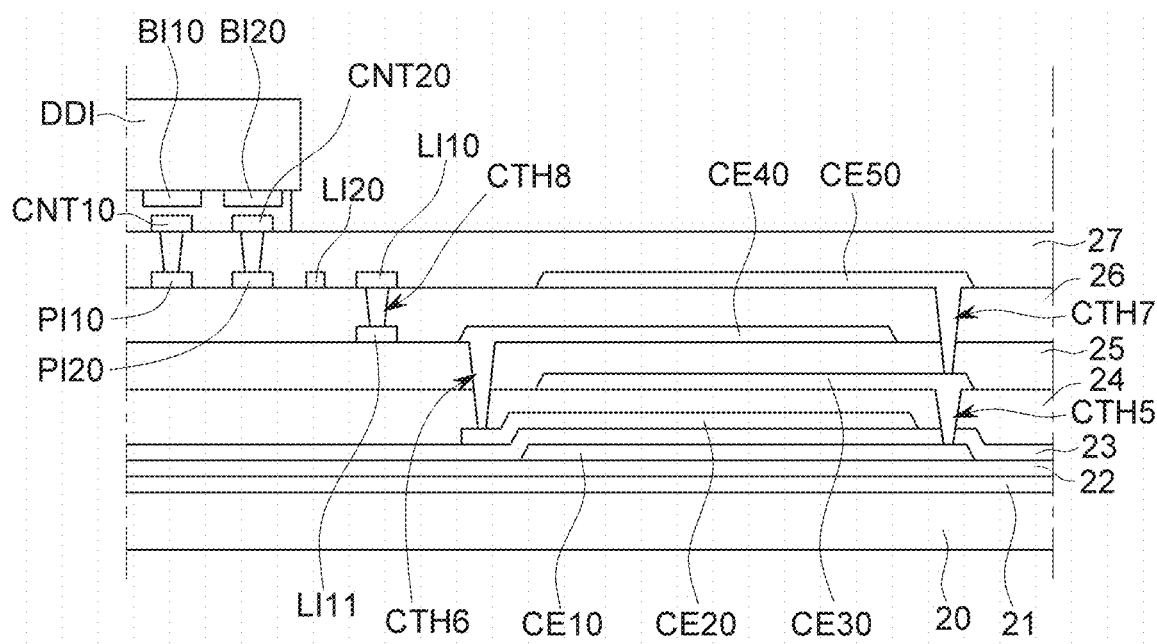
FIG. 16 is a cross-sectional view taken along line IV-IV' in FIG. 15.

FIG. 15 is a plan view illustrating a capacitor according to an embodiment, and FIG. 16 is a cross-sectional view taken along line IV-IV' in FIG. 15.

In an embodiment, a capacitor C6 is a multilayer capacitor in which three or more capacitor electrodes CE10, CE20, CE30, CE40, and CE50 overlap each other in a thickness direction. The multilayer capacitor C6 may be connected to the display driving chip DDI and corresponds to the first to sixth capacitors described above with reference to FIGS. 9 to 14. The multilayer capacitor C6 may have a laminated structure substantially the same as that of the display substrate DS described above with reference to FIG. 7. Accordingly, any repetitive detailed description of each layer will be omitted.

The buffer layer 21 is disposed on the base substrate 20. In such an embodiment, the gate insulating layer 22 is disposed on the buffer layer 21. In such an embodiment, the first gate conductive layer is disposed on the gate insulating layer 22.

The first gate conductive layer includes a first capacitor electrode CE10.

The first insulating interlayer 23 is disposed on the first gate conductive layer. The second gate conductive layer is disposed on the first insulating interlayer 23.

The second gate conductive layer includes a second capacitor electrode CE20.

The second insulating interlayer 24 is disposed on the second gate conductive layer. The first source/drain conductive layer is disposed on the second insulating interlayer 24.

The first source/drain conductive layer includes a third capacitor electrode CE30. The third capacitor electrode CE30 is disposed through the first insulating interlayer 23 and the second insulating interlayer 24 and is connected to the first capacitor electrode CE10 through a contact hole CTH5 defined through the first insulating interlayer 23 and the second insulating interlayer 24 to expose the first capacitor electrode CE10.

The first via layer 25 is disposed on the first source/drain conductive layer. The second source/drain conductive layer is disposed on the first via layer 25.

The second source/drain conductive layer includes a fourth capacitor electrode CE40 and a first connection line LI1_1. The fourth capacitor electrode CE40 is disposed through the second insulating interlayer 24 and the first via layer 25 and is connected to the second capacitor electrode CE20 through a contact hole CTH6 defined through the second insulating interlayer 24 and the first via layer 25 to expose the second capacitor electrode CE20.

The second via layer 26 is disposed on the second source/drain conductive layer, and a fifth capacitor electrode CE50, a second connection line LI10 and a third connection line L120 are disposed on the second via layer 26. The fifth capacitor electrode CE50 may be defined by a portion of a layer including the anode electrode ANO disposed on the second via layer 26. The fifth capacitor electrode CE50 is disposed through the first via layer 25 and the second via layer 26 and is connected to the third capacitor electrode CE30 through a contact hole CTH7 defined through the first via layer 25 and the second via layer 26 to expose the third capacitor electrode CE30.

The pixel defining layer 27 may be disposed on the fifth capacitor electrode CE50.

The buffer layer 21, the gate insulating layer 22, the first interlayer insulating layer 23, the second interlayer insulating layer 24, the first via layer 25, the second via layer 26 and the pixel defining layer 27 may be referred to as first to seventh insulating layers disposed between or above/below the capacitor electrodes CE10, CE20, CE30, CE40, and CE50, respectively.

The first connection line LI11 is disposed on the first via layer 25. One end of the first connection line LI11 is connected to the fourth capacitor electrode CE40, and another end thereof includes a pad that is exposed by a contact hole CTH8.

The second connection line LI10 is disposed on the second via layer 26. One end of the second connection line LI10 is connected to a first input side connection pad PI10, and another end thereof is connected to a pad of the first connection line LI11 that is exposed by the contact hole CTH8. The first input side connection pad PI10 is connected to the first input side bump BI10 through a first contact CNT10 disposed at a contact hole.

The third connection line LI20 is disposed on the second via layer 26. One end of the third connection line LI20 is connected to a second input side connection pad PI20, and another end thereof is connected to the fifth capacitor electrode CE50. The second input side connection pad PI20 is connected to the second input side bump BI20 through a second contact CNT20 disposed at a contact hole.

According to an embodiment, two of the capacitor electrodes CE10, CE20, CE30, CE40, and CE50 that are adjacent to each other are insulated from each other, and two of the capacitor electrodes CE10, CE20, CE30, CE40, and CE50 with another of the capacitor electrodes CE10, CE20, CE30, CE40, and CE50 disposed therebetween are connected to each other. Referring to FIG. 16, the first, third and fifth capacitor electrodes CE10, CE30 and CE50 are connected to each other and connected to one input side bump BI20. The second and fourth capacitor electrodes CE20 and CE40 are connected to each other and connected to another input side bump BI10.

Accordingly, in such an embodiment, a capacitance between the first and second input side bumps BI10 and BI20 from the display driving chip DDI is substantially equal to a sum of a first capacitance formed between the first capacitor electrode CE10 and the second capacitor electrode CE20, a second capacitance formed between the second capacitor electrode CE20 and the third capacitor electrode CE30, a third capacitance formed between the third capacitor electrode CE30 and the fourth capacitor electrode CE40, and a fourth capacitance formed between the fourth capacitor electrode CE40 and the fifth capacitor electrode CE50.

Figure 17:
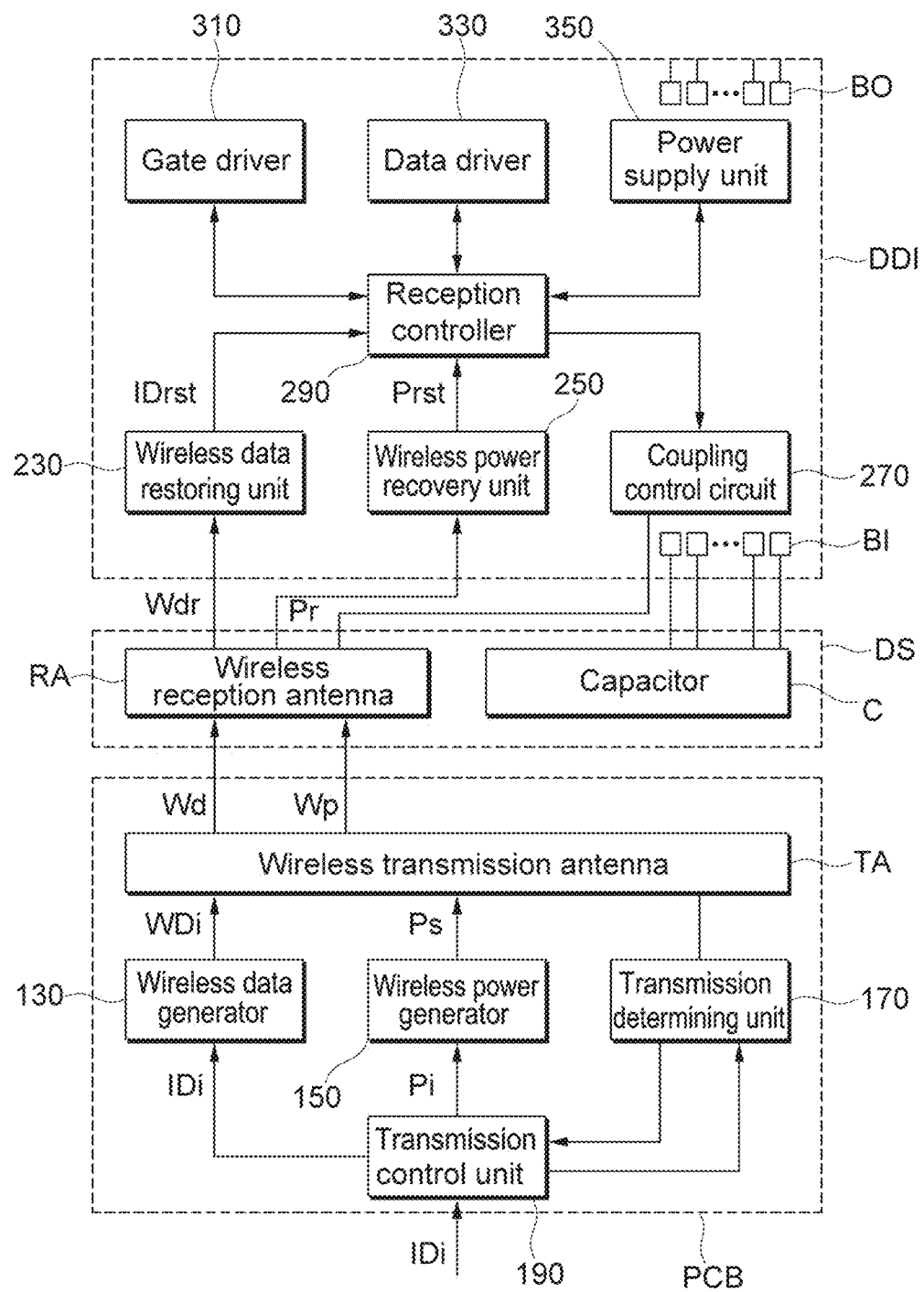
FIG. 17 is a schematic block diagram illustrating a display device according to an embodiment.

FIG. 17 is a schematic block diagram illustrating a display device according to an embodiment.

Referring to FIG. 17, the PCB may include a wireless transmission antenna TA, a wireless data generation unit 130, a wireless power generation unit 150, a transmission determination unit 170, and a transmission controller 190.

The transmission controller 190 may control an overall operation of the wireless data generation unit 130, the wireless power generation unit 150 and the transmission determination unit 170. The transmission controller 190 may receive an input image data IDi and transmit the input image data IDi to the wireless data generation unit 130. In one embodiment, for example, the transmission controller 190 may perform processing such as compensation, conversion, and correction on the input image data IDi, as desired, and output the processed input image data Di to the wireless data generation unit 130.

In such an embodiment, the transmission controller 190 may output an input power Pi. The transmission controller 190 may directly generate the input power Pi or may receive the input power Pi from outside and transmit the input power Pi to the wireless power generation unit 150. In one embodiment, for example, the transmission controller 190 may perform processing such as a voltage increase or a voltage decrease on the input power Pi, as desired, and output the processed input power Pi to the wireless power generation unit 150.

The wireless data generation unit 130 receives the input image data Idi, and converts the input image data Di into a data transmission signal WDi so that the input image data Idi may be wirelessly transmitted through the wireless transmission antenna TA. In one embodiment, for example, the data transmission signal WDi may be an AC current or voltage corresponding to the input image data IDi. In an embodiment, the data transmission signal WDi may have an AC current or voltage value corresponding to a high logic level (e.g., "1") and a low logic level (e.g., "0") of the input image data Idi.

The wireless power generation unit 150 receives the input power Pi, and converts the input power Pi into a transmission power Ps so that the input power Pi may be wirelessly transmitted through the wireless transmission antenna TA. In one embodiment, for example, the transmission power Ps may be an AC current or voltage corresponding to the input power Pi.

The wireless transmission antenna TA may perform a function of wirelessly transmitting data or power. The wireless transmission antenna TA may receive the data transmission signal WDi and wirelessly transmit the data transmission signal WDi as the wireless data Wd. In addition, the wireless transmission antenna TA may receive the transmission power Ps and wirelessly transmit the transmission power Ps as the wireless power Wp.

The transmission determination unit 170 may determine whether the wireless data Wd and/or the wireless power Wp has been effectively transmitted, and may transmit a determination result to the transmission controller 190. As the data transmission signal WDi and/or the transmission power Ps is applied to the wireless transmission antenna TA, the transmission determination unit 170 may sense a pad current Ip flowing through the wireless transmission antenna TA or a pad voltage applied thereto, and may determine whether the wireless data Wd and/or the wireless power Wp is effectively transmitted wirelessly based on the pad current Ip or the pad voltage.

The display panel DP may include the wireless reception antenna RA and the plurality of capacitors C included in the display substrate DS; and a wireless data restoring unit 230, a wireless power recovery unit 250, a coupling control circuit 270, a reception controller 290, a gate driver 310, a data driver 330, and a power supply unit 350. The display panel DP may further include the input side bump BI connected to the capacitor C for driving the wireless data restoring unit 230, the wireless power recovery unit 250, the coupling control circuit 270, the reception controller 290, the gate driver 310, the data driver 330, and the power supply unit 350. In such an embodiment, the display panel DP may further include the output side bump BO for applying a gate signal, a data signal, and a power output from the gate driver 310, the data driver 330, and the power supply unit 350 to the pixels.

The wireless reception antenna RA wirelessly receives the wireless data Wd and the wireless power Wp, and outputs the data reception signal Wdr in response to the wireless data Wd and outputs a reception power Pr in response to the wireless power Wp. In one embodiment, for example, the data reception signal Wdr may be an AC current or voltage corresponding to the wireless data Wd, and the reception power Pr may be an AC current or voltage corresponding to the wireless power Wp.

The wireless data restoring unit 230 receives the data reception signal Wdr, and generates a restored image data IDrst based on the data reception signal Wdr to restore the input image data IDi. The restored image data IDrst may have a form that may be processed by the reception controller 290 or the data driver 330, and may have a high logic level and a low logic level corresponding to the data reception signal Wdr. The wireless data restoring unit 230 may output the restored image data IDrst to the reception controller 290.

The wireless power recovery unit 250 receives the reception power Pr, and generates a recovery power Prst based on the reception power Pr. The recovery power Prst may have a form that is usable in the reception controller 290, the gate driver 310, or the data driver 330, and may be a direct-current ("DC") power.

The coupling control circuit 270 may control a resonant frequency of the wireless reception antenna RA.

Efficiency of wireless transmission and wireless reception between the wireless transmission antenna TA and the wireless reception antenna RA increases as the coupling between the wireless transmission antenna TA and the wireless reception antenna RA increases, and the coupling therebetween may increase as a resonance frequency of the transmission antenna TA coincides with the resonance frequency of the wireless reception antenna RA. The resonance frequency of the wireless reception antenna RA may be determined by a magnetic impedance of the wireless reception antenna RA.

In an embodiment, the driving circuit element DE or the capacitor C disposed on the display substrate DS may control the resonance frequency of the wireless reception antenna RA by adjusting the magnetic impedance of the wireless reception antenna RA. Accordingly, in such an embodiment, the display driving chip DDI may control wireless transmission and wireless reception between the wireless transmission antenna TA and the wireless reception antenna RA by controlling the magnetic impedance and the resonance frequency of the wireless reception antenna RA.

The reception controller 290 may control the overall operation of the wireless data restoring unit 230, the wireless power recovery unit 250 and the coupling control circuit 270. The reception controller 290 may receive the restored image data IDrst and the recovery power Prst, and may transmit the restored image data IDrst and the recovery power Prst to the gate driver 310, the data driver 330 and the power supply unit 350. The gate driver 310 applies the gate signal to the gate lines GL1 to GLn through the output side bump BO. The data driver 330 applies the data signal to the data lines DL1 to DLm through the output side bump BO. The power supply unit 350 may apply a high potential voltage power to the power voltage line ELVDDL through the output side bump BO. The power supply unit 350 may apply a low potential voltage power to the cathode electrode CAT through the output side bump BO.

Each of the wireless data restoring unit 230, the wireless power recovery unit 250, the coupling control circuit 270, the reception controller 290, the gate driver 310, the data driver 330 and the power supply unit 350 may be connected to the capacitor C through the input side bump BI.

In one embodiment, for example, the capacitor C may be a high-capacitance capacitor for power stabilization which serves as a kind of buffer for supplying stable power, a noise canceling capacitor for removing a high-frequency noise signal, and a boosting capacitor used for a boost converter for increasing a level of a DC voltage.

Figure 18:
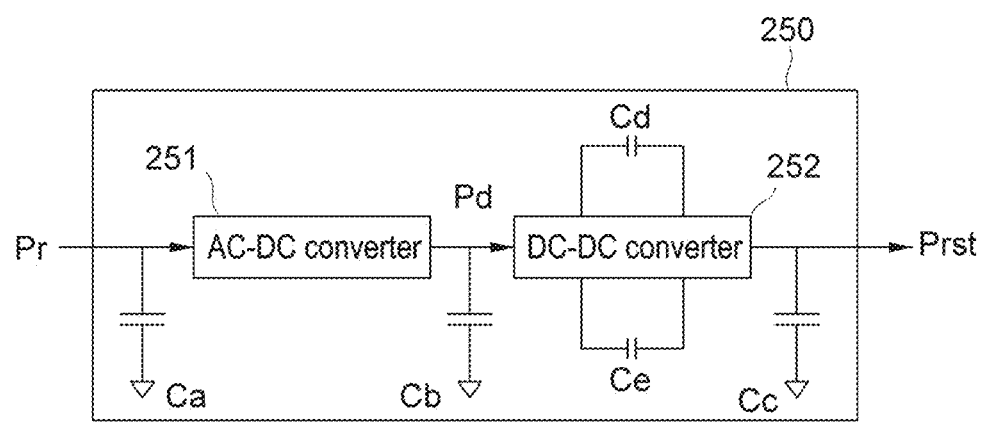
FIG. 18 is a schematic block diagram illustrating an embodiment of a wireless power recovery unit illustrated in FIG. 17.

FIG. 18 is a schematic block diagram illustrating an embodiment of a wireless power recovery unit illustrated in FIG. 17.

The wireless power recovery unit 250 may include an AC-DC converter 251 for converting an AC voltage Pr into a DC voltage Pd, and a DC-DC converter 252 for changing or converting the DC voltage Pd.

Each of input/output terminals of the AC-DC converter 251 and the DC-DC converter 252 are connected to corresponding ones of the capacitors Ca, Cb and Cc through the input side bump BI. The capacitors Ca, Cb and Cc may stabilize input/output power voltage and remove noise. In one embodiment, for example, a first capacitor electrode CE1 of each of the capacitors Ca, Cb and Cc is connected to corresponding one of the input/output terminals of the AC-DC converter 251 and the DC-DC converter 252 through three different input side bumps BI. A second capacitor electrode CE2 of each of the capacitors Ca, Cb and Cc may be connected to one common input side bump BI that is grounded.

In such an embodiment, capacitors Cd and Ce are connected between the input/output terminals of the DC-DC converter 252 through the input side bumps BI. In one embodiment, for example, each of first capacitor electrodes CE1 and second capacitor electrodes CE2 of the capacitors Cd and Ce are connected to the DC-DC converter 252 through four different input side bumps BI. The capacitors Cd and Ce may serve as a boosting capacitor or a charge-pumping capacitor that increases/decreases the input DC voltage Pd.

As set forth hereinabove, according to embodiments of the invention, a circuit element for a display driving chip disposed on a display substrate, in particular, a wireless reception antenna and a capacitor are formed of or defined by a metal layer of the display substrate. Accordingly, the circuit element for the display driving chip may be formed during a manufacturing process of the display substrate without an additional circuit element attaching process. Accordingly, a display panel, in which circuit elements are stably connected, may be manufactured without increasing the thickness of the display panel.

In embodiments of the invention, image data and power are received through a wireless transmission antenna and a wireless reception antenna and a driving chip for driving the display driving chip is disposed on the display substrate, such that the display substrate and a PCB are not bonded to each other and a current path through which a current flows may not be formed.

In embodiments of the invention, a high-capacity capacitor may be provided by forming a capacitor electrode extending along a non-display area, by connecting a plurality of capacitors arranged along a non-display area in parallel, or by forming a multilayer capacitor that includes three or more layers.

While the invention has been illustrated and described with reference to the embodiments thereof, it will be apparent to those of ordinary skill in the art that various changes in form and detail may be made thereto without departing from the spirit and scope of the invention.

What is claimed is:

1. A display device comprising:
    a display substrate in which a display area and a non-display area surrounding the display area are defined, wherein the display area comprises a plurality of pixels; and
    a display driving chip disposed on the display substrate, wherein the display substrate comprises:
        a base substrate;
        a first conductive layer disposed on the base substrate;
        a first insulating layer disposed on the first conductive layer; and
        a second conductive layer disposed on the first insulating layer,
        wherein the first conductive layer comprises a first capacitor electrode disposed in the non-display area,
        wherein the second conductive layer comprises a second capacitor electrode disposed in the non-display area,
        wherein the first and second capacitor electrodes overlap each other with the first insulating layer therebetween and collectively define a first capacitor,
        wherein the first and second capacitor electrodes are connected to the display driving chip,
        wherein the first conductive layer further comprises a third capacitor electrode which is disposed in the non-display area and spaced apart from the first capacitor electrode,
        wherein the second conductive layer further comprises a fourth capacitor electrode which is disposed in the non-display area and spaced apart from the second capacitor electrode, and
        wherein the third and fourth capacitor electrodes overlap each other with the first insulating layer therebetween and collectively define a second capacitor.

2. The display device of claim 1, wherein a length of each of the first and second capacitor electrodes in a length direction of the non-display area is greater than a length thereof in a width direction of the non-display area.

3. The display device of claim 2, wherein the length of each of the first and second capacitor electrodes in the length direction of the non-display area is about five times or greater the length thereof in the width direction of the non-display area.

4. The display device of claim 1, wherein
    the display substrate further comprises a second insulating layer disposed on the second conductive layer, and
    the display driving chip is disposed on the second insulating layer.

5. The display device of claim 4, wherein
    the display driving chip comprises a plurality of bumps disposed on a surface of the display driving chip which faces the second insulating layer,
    the first capacitor electrode is connected to a first bump, and
    the second capacitor electrode is connected to a second bump which is spaced apart from the first bump.

6. The display device of claim 1, wherein
    the first and third capacitor electrodes are disposed along a length direction of the non-display area, and
    the first and third capacitor electrodes have different lengths from each other in the length direction of the non-display area and have a same length as each other in the width direction of the non-display area.

7. The display device of claim 5, wherein
    the third capacitor electrode is connected to the first bump, and
    the fourth capacitor electrode is connected to the second bump.

8. The display device of claim 5, wherein
    the third capacitor electrode is connected to a third bump which is spaced apart from the first and second bumps, and
    the fourth capacitor electrode is connected to a fourth bump which is spaced apart from the first, second and third bumps.

9. The display device of claim 5, wherein
    one of the third and fourth capacitor electrodes is connected to a fifth bump which is spaced apart from the first and second bumps, and
    the other of the third and fourth capacitor electrodes is connected to one of the first and second bumps.

10. The display device of claim 9, wherein a ground voltage is applied to one of the first and second bumps.

11. A display device comprising:
    a display substrate in which a display area and a non-display area surrounding the display area are defined, wherein the display area comprises a plurality of pixels; and
    a display driving chip disposed on the display substrate, wherein the display comprises:
        a base substrate;
        a first conductive layer disposed on the base substrate;
        a first insulating layer disposed on the first conductive layer; and
        a second conductive layer disposed on the first insulating layer,
        wherein the first conductive layer comprises a first capacitor electrode disposed in the non-display area,
        wherein the second conductive layer comprises a second capacitor electrode disposed in the non-display area,
        wherein the first and second capacitor electrodes overlap each other with the first insulating layer therebetween and collectively define a first capacitor, and
        wherein the first and second capacitor electrodes are connected to the display driving chip,
    wherein
        the display substrate further comprises:
            a second insulating layer disposed on the second conductive layer; and
            a third conductive layer disposed on the second insulating layer,
        the third conductive layer comprises a third capacitor electrode disposed in the non-display area,
        the second and third capacitor electrodes overlap each other with the second insulating layer therebetween, and
        the second capacitor electrode is connected to the first capacitor electrode.

12. The display device of claim 11, wherein
the display substrate further comprises:
- a third insulating layer disposed on the third conductive layer; and
- a fourth conductive layer disposed on the third insulating layer, the fourth conductive layer comprises a fourth capacitor electrode disposed in the non-display area, the third and fourth capacitor electrodes overlap each other with the third insulating layer therebetween, and the fourth capacitor electrode is connected to the second capacitor electrode.

13. The display device of claim 1, wherein
the display device further comprises a printed circuit board disposed on a rear surface of the display substrate, the printed circuit board comprises a wireless transmission antenna, and the display substrate comprises a wireless reception antenna disposed in the non-display area and coupled to the wireless transmission antenna.

14. The display device of claim 13, wherein the wireless reception antenna wirelessly receives an image data signal and a power from the wireless transmission antenna, and transmits the received image data signal and the received power to the display driving chip.

15. The display device of claim 13, wherein at least one of the first and second conductive layers comprises the wireless reception antenna.

16. The display device of claim 13, wherein the wireless reception antenna is connected to the first capacitor.

17. The display device of claim 1, wherein
the display driving chip comprises a direct-current-to-direct-current converter, and the first capacitor is connected to the direct-current-to-direct-current converter.

18. The display device of claim 1, wherein
the display driving chip comprises a data driver, and the first capacitor is connected to the data driver.

19. The display device of claim 1, wherein
the display driving chip comprises a power supply unit, and the first capacitor is connected to the power supply unit.

* * * * *